United States Patent
Ota

(10) Patent No.: US 12,037,460 B2
(45) Date of Patent: Jul. 16, 2024

(54) MULTI-COMPONENT TYPE THERMALLY CONDUCTIVE SILICONE-GEL COMPOSITION, THERMALLY CONDUCTIVE MATERIAL AND HEAT-EMISSION STRUCTURE

(71) Applicant: DOW TORAY CO., LTD., Tokyo (JP)

(72) Inventor: Kenji Ota, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 538 days.

(21) Appl. No.: 17/442,651

(22) PCT Filed: Mar. 18, 2020

(86) PCT No.: PCT/JP2020/012000
§ 371 (c)(1),
(2) Date: Sep. 24, 2021

(87) PCT Pub. No.: WO2020/203299
PCT Pub. Date: Oct. 8, 2020

(65) Prior Publication Data
US 2022/0169799 A1    Jun. 2, 2022

(30) Foreign Application Priority Data
Mar. 29, 2019    (JP) .................................. 2019-065809

(51) Int. Cl.
| | |
|---|---|
| *C08G 77/20* | (2006.01) |
| *C08K 3/38* | (2006.01) |
| *C08K 7/18* | (2006.01) |
| *H01L 23/373* | (2006.01) |
| *H01M 10/653* | (2014.01) |

(52) U.S. Cl.
CPC .............. *C08G 77/20* (2013.01); *C08K 3/38* (2013.01); *C08K 7/18* (2013.01); *H01L 23/3737* (2013.01); *H01M 10/653* (2015.04); *C08K 2003/385* (2013.01); *C08K 2201/001* (2013.01); *C08K 2201/003* (2013.01); *C08K 2201/005* (2013.01)

(58) Field of Classification Search
CPC . C08G 77/20; C08K 3/38; C08K 7/18; C08K 2003/385; C08K 2201/001; C08K 2201/003; C08K 2201/005; H01M 10/653; H01L 23/3737
USPC ........................................................ 524/701
See application file for complete search history.

(56) References Cited

U.S. PATENT DOCUMENTS

| | | | |
|---|---|---|---|
| 5,158,906 A | 10/1992 | Huang | |
| 5,349,037 A | 9/1994 | Fujiki et al. | |
| 5,665,805 A | 9/1997 | Hatanaka et al. | |
| 5,936,032 A | 8/1999 | Angus, Jr. | |
| 6,169,142 B1 | 1/2001 | Nakano et al. | |
| 2002/0010245 A1 | 1/2002 | Enami et al. | |
| 2003/0049466 A1 | 3/2003 | Yamada et al. | |
| 2004/0254275 A1 | 12/2004 | Fukui et al. | |
| 2004/0265599 A1 | 12/2004 | Ushio et al. | |
| 2006/0100336 A1 | 5/2006 | Fukui | |
| 2009/0105441 A1 | 4/2009 | Ushio et al. | |
| 2011/0188213 A1 | 8/2011 | Domae et al. | |
| 2011/0248211 A1 | 10/2011 | Matsumoto et al. | |
| 2013/0303676 A1 | 11/2013 | Otashiro et al. | |
| 2014/0066570 A1 | 3/2014 | Kodama et al. | |
| 2014/0094554 A1 | 4/2014 | Matsumoto et al. | |
| 2015/0344671 A1 | 12/2015 | Furukawa et al. | |
| 2016/0340548 A1 | 11/2016 | Gubbels et al. | |
| 2017/0212287 A1 | 7/2017 | Lee et al. | |
| 2017/0306099 A1 | 10/2017 | Yamaguchi et al. | |
| 2018/0230172 A1 | 8/2018 | Furukawa et al. | |
| 2019/0127531 A1 | 5/2019 | Fukui et al. | |
| 2020/0087514 A1 | 3/2020 | Fukui et al. | |
| 2020/0239758 A1 | 7/2020 | Ota | |

(Continued)

FOREIGN PATENT DOCUMENTS

| | | |
|---|---|---|
| JP | H10195085 A | 7/1998 |
| JP | H10316861 A | 12/1998 |

(Continued)

OTHER PUBLICATIONS

Machine assisted English translation of JP2003176462A obtained from https://worldwide.espacenet.com/patent on Feb. 20, 2024, 16 pages.
Machine assisted English translation of JP2012078144A obtained from https://worldwide.espacenet.com/patent on Feb. 20, 2024, 12 pages.
Machine assisted English translation of JP2016084378A obtained from https://patents.google.com/patent on Jan. 25, 2023, 9 pages.
International Search Report for PCT/JP2020/012000 dated Jun. 2, 2020, 3 pages.
Machine assisted English translation of JP2008150491A obtained from https://patents.google.com/patent on Oct. 26, 2021, 8 pages.

(Continued)

*Primary Examiner* — Kelechi C Egwim
(74) *Attorney, Agent, or Firm* — Warner Norcross + Judd LLP

(57) ABSTRACT

Provided is a thermally conductive silicone gel composition having high thermal conductivity, excellent extrudability and mixing stability, resistance to separation of each liquid even in a two-component package, stable storage, and superior gap fill properties for heat dissipating components, and the like. A multi-component thermally conductive silicone gel composition comprises: (A-1) an alkenyl group-containing organopolysiloxane having a degree of polymerization of 5 to 100; (A-2) an alkenyl group-containing organopolysiloxane having a degree of polymerization of 400 or more; (B) an organohydrogenpolysiloxane; (C) a catalyst for hydrosilylation reaction; (D) a thermally conductive filler; (E) a silane coupling agent, and the like; and (F) an organopolysiloxane having a hydrolyzable silyl group at the end of the molecular chain. A mixture viscosity of component (A-1) and component (A-2) is within a range of 1.15 to 5.50 times the viscosity of the component (A-1) at 25° C.

17 Claims, No Drawings

(56) References Cited

U.S. PATENT DOCUMENTS

| | | | |
|---|---|---|---|
| 2020/0270499 A1* | 8/2020 | Ota | .................. C09K 5/14 |
| 2020/0270500 A1 | 8/2020 | Ota | |
| 2021/0147681 A1 | 5/2021 | Hirakawa et al. | |
| 2021/0238365 A1 | 8/2021 | Fukui et al. | |
| 2021/0261844 A9 | 8/2021 | Ota et al. | |
| 2022/0153999 A1 | 5/2022 | Ota | |
| 2022/0185992 A1 | 6/2022 | Ota et al. | |

FOREIGN PATENT DOCUMENTS

| | | | |
|---|---|---|---|
| JP | H11209618 A | 8/1999 | |
| JP | 2000001616 A | 1/2000 | |
| JP | 2003176462 A | 6/2003 | |
| JP | 2005162975 A | 6/2005 | |
| JP | 2006265529 A | 10/2006 | |
| JP | 2006348119 A | 12/2006 | |
| JP | 2008150491 A | 7/2008 | |
| JP | 2009286855 A | 12/2009 | |
| JP | 4646357 B2 | 3/2011 | |
| JP | 2011144234 A | 7/2011 | |
| JP | 2011144234 A * | 7/2011 | |
| JP | 2012069783 A | 4/2012 | |
| JP | 2012078144 A | 4/2012 | |
| JP | 2012219113 A | 11/2012 | |
| JP | 2013091683 A | 5/2013 | |
| JP | 2013216716 A | 10/2013 | |
| JP | 5365572 B2 | 12/2013 | |
| JP | 5699901 B2 | 4/2015 | |
| JP | 5733087 B2 | 6/2015 | |
| JP | 2015110792 A | 6/2015 | |
| JP | 5846323 B2 | 1/2016 | |
| JP | 2016084378 A | 5/2016 | |
| TW | 201819539 A | 6/2018 | |
| WO | 2011002101 A2 | 1/2011 | |
| WO | 2012157225 A1 | 11/2012 | |
| WO | 2015023001 A1 | 2/2015 | |
| WO | 2015093139 A1 | 6/2015 | |
| WO | 2017183541 A1 | 10/2017 | |
| WO | 2018016566 A1 | 1/2018 | |
| WO | WO-2018016566 A1 * | 1/2018 | ............. C08G 77/08 |
| WO | 2019021824 A1 | 1/2019 | |
| WO | 2019021825 A1 | 1/2019 | |
| WO | 2019021826 A1 | 1/2019 | |

OTHER PUBLICATIONS

Machine assisted English translation of JP2011144234A obtained from https://patents.google.com/patent on Oct. 26, 2021, 6 pages.
Machine assisted English translation of JP2012069783A obtained from https://patents.google.com/patent on Oct. 26, 2021, 14 pages.
Machine assisted English translation of JP5699901A obtained from https://patents.google.com/patent on Oct. 21, 2021, 11 pages.
Machine assisted English translation of JP2015110792A obtained from https://patents.google.com/patent on Oct. 26, 2021, 11 pages.
Machine assisted English translation of JPH10195085A obtained from https://patents.google.com/patent on Oct. 21, 2021, 10 pages.
Machine assisted English translation of JP2006265529A obtained from https://patents.google.com/patent on Oct. 21, 2021, 8 pages.
Machine assisted English translation of JP2013216716A obtained from https://patents.google.com/patent on Oct. 21, 2021, 9 pages.
Machine assisted English translation of JPH11209618A obtained from https://patents.google.com/patent on Dec. 14, 2021, 7 pages.
Machine assisted English translation of JP2005162975A obtained from https://patents.google.com/patent on Dec. 14, 2021, 10 pages.
Machine assisted English translation of JP2013091683A obtained from https://patents.google.com/patent on Feb. 2, 2022, 10 pages.
Machine assisted English translation of JP5846323B2 obtained from https://patents.google.com/patent on Jan. 11, 2023, 10 pages.

* cited by examiner

MULTI-COMPONENT TYPE THERMALLY CONDUCTIVE SILICONE-GEL COMPOSITION, THERMALLY CONDUCTIVE MATERIAL AND HEAT-EMISSION STRUCTURE

CROSS-REFERENCE TO RELATED APPLICATIONS

This application is the U.S. National Stage of International Application No. PCT/JP2020/012000 filed on 18 Mar. 2020, which claims priority to and all advantages of Japanese Application No. 2019-065809 filed on 29 Mar. 2019, the content of which is incorporated herein by reference.

TECHNICAL FIELD

The present invention relates to a thermally conductive silicone gel composition as well as thermally conductive members and heat dissipating component developed therefrom having superior extrudability and mixing stability while having high thermal conductivity, where each liquid (composition) does not readily separate even in a package of a multi-component composition such as a two-part type, and that can be stably stored, has superior gap fill properties and, if desired, repair properties regarding the heat dissipation part.

BACKGROUND ART

In recent years, in order to efficiently dissipate the heat generated by electronic and electric equipment such as electronic components and batteries, along with high-density and high-integration on printed circuit boards and hybrid ICs on which electronic components such as transistors, ICs, and memory elements are mounted, and the increase in the capacity of secondary batteries (cell type), thermally conductive silicone compositions including organopolysiloxane, aluminum oxide powder, zinc oxide powder, and other thermally conductive fillers have been widely used and thermally conductive silicone composition filled with large amounts of thermally conductive filler have been proposed.

For example, Patent Document 1 and Patent Document 2 propose that by treating the surface of the thermally conductive filler with a hydrolyzable silane having a long chain alkyl group, even if the thermally conductive inorganic filler is highly filled in these thermally conductive silicone compositions, flexibility and heat-resistant mechanical properties are imparted to the molded product, and rise in viscosity is reduced, enhancing moldability, enabling achieving a thermally conductive silicone composition having high thermal conductivity. Patent Document 3 also proposes a thermally conductive silicone composition in which two or more thermally conductive fillers with different molecular weights that are surface treated with treatment agents blended together, where changing the timing of the addition of the treatment agents causes the flowability of the compound to not be impaired even with high fill amount of thermally conductive filler.

However, although the viscosity of these thermally conductive silicone compositions can be reduced to a certain extent and their moldability can be improved, precise application to the structure of highly precise electrical and electronic materials is difficult due to their insufficient flowability. In addition, there are cases where sufficient heat dissipation cannot be achieved, such as when a gap is created between the composition and electronic components for which heat is to be dissipated.

As an additive-curable silicone material for electronic material applications, the form of a multi-component composition in which a composition containing the cross-linking organohydrogenpolysiloxane and a composition not containing the cross-linking organohydrogenpolysiloxane being distributed in different packages that are stored separately and mixed at the time of use is known, but the patent documents 1 to 3 do not disclose a multi-component thermally conductive silicone composition, and in particular a stable, multi-component, thermally conductive silicone composition containing large amounts of organohydrogenpolysiloxane, a cross-linking agent, and thermally conductive fillers is not known.

RELATED ART DOCUMENTS

Patent Documents

Patent Document 1: Japanese Unexamined Patent Application Publication No. H11-209618
Patent Document 2: Japanese Unexamined Patent Application No. 2000-001616
Patent Document 3: Japanese Unexamined Patent Application No. 2005-162975

SUMMARY OF THE INVENTION

Problem to be Solved by the Invention

In addition, the inventors have found a new problem. In thermally conductive silicone compositions, if a multi-component composition form is to be selected to improve storage stability and handleability thereof, the content of thermally conductive filler must be extremely high in compositions for high heat dissipation area of 2.0 W/mK or higher, as described above. On the other hand, if the viscosity and thermally conductive filler content of each composition constituting the multi-component differ greatly, it will be difficult to extrude and to mix each composition uniformly in the mixer for use. However, when designing a multi-component composition liquid with a high content of thermally conductive filler and organohydrogenpolysiloxane as a cross-linking agent, designing a multi-component thermally conductive silicone composition as a stable package was difficult due to separation of the thermally conductive filler over time. The present inventors have found that even if the surface treatment agents proposed in Patent Documents 1 to 3 described above are used, these surface treatment agents separate from the thermally conductive filler, and long term stable storage is difficult. In addition, non-uniform mixing of the composition had been confirmed to occur in the mixer due to the inability to discharge stably, resulting in variations in curability and poor appearance.

An object of the present invention is to provide a multi-component thermally conductive silicone gel composition that resolves the problems described above, has high thermal conductivity of 2.0 W/mK or higher, precision coatability, and superior gap fill properties regarding electronic components and the like due to the entire composition maintaining high flowability after mixing even with a high filler amount of thermally conductive inorganic filler where even with a multi-component composition package of two-part type or the like; each liquid (composition), in particular, a composition including low viscosity organopolysiloxanes that impart flowability, do not readily separate enabling preventing non-uniform hardness caused by organopolysiloxanes separation and poor dispersion of catalyst for hydrosilylation reaction while mixing using a static mixer. Furthermore, since the resulting thermally conductive cured product is a soft gel composition, it can prevent damage to the components by alleviating stress caused by the difference in the rate of thermal expansion between the electronic components and the heat dissipation structure. An additional object of the present invention is to provide a thermally conductive member using the thermally conductive silicone gel composition and a heat-dissipating structure using this member.

Means for Solving the Problem

As a result of intensive investigation, the inventors have designed a composition containing a large amount of thermally conductive filler to provide high thermal conductivity, and including in the same system as the organopolysiloxane of component (A-1), which is the base compound, the organopolysiloxane of component (A-2) in a range where the viscosity of the mixed polymer is 1.15 to 5.5 times the viscosity of component (A-1) at 25° C. The multi-component thermally conductive silicone gel composition thus achieved has to been found to resolve the problems described above, resulting in the present invention.

In other words, an object of the present invention is achieved by a multi-component thermally conductive silicone gel composition made up of:
(A) an alkenyl group-containing organopolysiloxane comprising the following component (A-1) and component (A-2), where
(A-1) is an alkenyl group-containing organopolysiloxane having a degree of polymerization of siloxane in the range of 5 to 100, and
(A-2) is an alkenyl group-containing organopolysiloxane having a degree of polymerization of siloxane of 400 or more;
(B) an organohydrogenpolysiloxane in an amount that provides 0.2 to 5 mol of silicon-bonded hydrogen atoms in component (B) with respect to 1 mol of alkenyl groups contained in component (A);
(C) a catalyst for a hydrosilylation reaction in a catalytic amount;
(D) thermally conductive filler;
(E) one or more silane coupling agents or hydrolysis/condensation reaction products thereof; and
(F) An organopolysiloxane having a hydrolyzable silyl group at the end of the molecular chain
contained in liquid (I) and liquid (II), where
the content of component (D) in liquid (I) is 600 to 3,500 parts by mass relative to 100 parts by mass of component (A-1), and
the content of component (D) in liquid (II) is 600 to 3,500 parts by mass relative to 100 parts by mass of component (A-1); moreover, where
component (A-1) and component (A-2) are present in the same system and the viscosity of these mixed polymers at 25° C. is in the range of 1.15 to 5.5 times the viscosity of component (A-1) at 25° C.

Here, it is particularly preferable that the viscosity at 25° C. of component (A-1) described above is in the range of 10 to 100 mPa-s, the viscosity at 25° C. of component (A-2) described above is 10,000 mPa-s or more, and component (A-1) and component (A-2) are present in the same system, and that the viscosity at 25° C. of these mixed polymers is in the range of 1.2 to 2.0 times that of component (A-1).

In addition, in each of said compositions, the content of component (D) in liquid (I) and liquid (II) is preferably in the range of 80 to 98% by mass of the entire composition, and the composition is preferably substantially free of fillers other than component (D). Furthermore, the composition preferably has a thermal conductivity of 2.0 W/mK, suitably 3.5 W/mK or more, and more suitably 4.0 W/mK or more.

The object of the present invention is suitably resolved when component (E) described above has (E1) an alkoxysilane having an alkyl group with six or more carbon atoms in the molecule, and component (D) described above is surface treated by component (E) and component (F). Further, the surface treatment by components (E) and (F) is preferably a heat surface treatment, and component (E1) is preferably a trialkoxysilane having an alkyl group with 6 to 18 carbon atoms. The surface treatment of component (D) by component (E) and component (F) in the liquid (I) and liquid (II) is particularly preferably carried out with component (E) as the main component, followed by surface treatment of component (D) with component (F) as the main component.

Component (F) may suitably be:
the multi-component thermally conductive silicone gel composition according to any one of claims 1 to 3, wherein component (F) is an organopolysiloxane represented by the following general formula (1) or general formula (2), or a mixture thereof.
(i) An organopolysiloxane represented by General Formula (1):

[Formula 1]

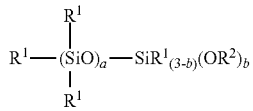 (1)

(In the formula, $R^1$ are independent unsubstituted or substituted monovalent hydrocarbon groups, and $R^2$ are independent hydrogen atoms, alkyl groups, alkoxyalkyl groups, or acyl groups, a is an integer from 5 to 250, and b is an integer from 1 to 3), with a viscosity of 10 to less than 10,000 mPa-s at 25° C.
(ii) An organopolysiloxane represented by General Formula (2):

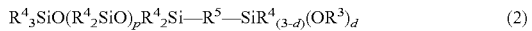 (2)

(In the formula, $R^4$ are the same or different monovalent hydrocarbon groups, $R^5$ is an oxygen atom or a divalent hydrocarbon group, $R^3$ is the same group as described above, p is an integer from 100 to 500, and d is the same integer as described above).

In addition, an object of the present invention is suitable resolution using the multi-component thermally conductive silicone gel composition, where component (B) is made up of (B1) a straight-chain organohydrogenpolysiloxane having a viscosity at 25° C. of 1 to 1,000 mPa-s and containing on average 2 to 4 silicon-bonded hydrogen atoms in the molecule, at least two of which are in the side molecular chain, with a relationship established between the silicon-bound hydrogen atoms ($[H_{B1}]$) in component (B1) of the composition and the content of silicon-bound hydrogen atoms in the organohydrogenpolysiloxane other than the component (B1) ($[H_{non-B1}]$), and the value of $[H_{non-B1}]/([H_{B1}]+[H_{non-B1}])$ is in the range of 0.0 to 0.70. Note, this value may be 0.0 to 0.50, 0.0 to 0.25, or 0.0.

An additional object of the present invention is suitable resolution using the thermally conductive silicone gel composition including (G) a heat resistance-imparting agent.

Similarly, an object of the present invention is suitable resolution using the multi-component thermally conductive silicone gel composition where said component (D) is:
- (D1) plate-shaped boron nitride powder with an average particle size of 0.1 to 150 μm;
- (D2) granulated or spherically compacted boron nitride powder with an average particle size of 0.1 to 500 μm;
- (D3) spherically melt-solidified and/or crushed aluminum oxide powder with an average particle diameter of 0.01 to 50 μm; or
- (D4) graphite having an average particle diameter of 0.01 to 50 μm; or
- a mixture of two or more of these.

Furthermore, an object of the present invention is suitable resolution using a thermally conductive member made up of these multi-component thermally conductive silicone gel compositions, and in particular by a thermally conductive member made up of the same composition cured. Suitable resolution is also achieved by a heat dissipation structure provided with these thermally conductive members.

In particular, suitable resolution is achieved using a heat dissipating structure including a heat dissipating member provided via a multi-component thermally conductive silicone gel composition or cured product thereof on a heat dissipating component or a circuit board on which the heat dissipating component is mounted.

Although said heat dissipation structure is not particularly limited, the structure is preferably an electric/electronic device such as an electric/electronic component, a secondary battery, or the like and can be applied using a prescribed BLT (Bond Line Thickness) for minute heat dissipation structures Effects of the Invention The present invention provides a multi-component thermally conductive silicone gel composition that has high thermal conductivity of 3.5 W/mK or higher, precision coatability, and superior gap fill properties regarding electronic components and the like due to the entire composition maintaining high flowability after mixing even with a high filler amount of thermally conductive inorganic filler where even with a two-part type multi-component composition package or the like; each liquid (composition), in particular, a composition including low viscosity organopolysiloxanes that impart flowability, do not readily separate, enabling preventing non-uniform hardness caused by organopolysiloxane separation and poor dispersion of the catalyst for hydrosilylation reaction while mixing using a static mixer. Furthermore, since the resulting thermally conductive cured product is a soft gel composition, it can prevent damage to the components by alleviating stress caused by the difference in the rate of thermal expansion between the electronic components and the heat dissipation structure. In addition, the resulting thermally conductive cured product has high peelability, and a composition with excellent repairability of electronic components can be designed. The present invention also provides a thermally conductive member using said thermally conductive silicone gel composition, and a heat dissipating structure using said member (in particular, a heat dissipating structure of an electric or electronic device, including a heat dissipating structure of an electric or electronic component and a heat dissipating structure of a secondary battery).

DESCRIPTION OF THE PREFERRED EMBODIMENT

[Multi-Component Thermally Conductive Silicone Gel Composition]

The composition of the present invention is a multi-component thermally conductive silicone gel composition made up of:
- (A) an alkenyl group-containing organopolysiloxane comprising the following component
  (A-1) and component (A-2),
  (A-1) an alkenyl group-containing organopolysiloxane having a degree of polymerization of siloxane in the range of 5 to 100 and
  (A-2) an alkenyl group-containing organopolysiloxane having a degree of polymerization of siloxane of 400 or more;
- (B) an organohydrogenpolysiloxane;
- (C) a catalyst for hydrosilylation reaction;
- (D) a thermally conductive filler;
- (E) one or more silane coupling agents or hydrolytic condensation products thereof; and
- (F) an organopolysiloxane having a hydrolyzable silyl group at the end of a molecular chain, and
- including at least liquid (I) and liquid (II) described below stored separately.

Herein, component (A-1) is suitably an alkenyl group-containing organopolysiloxane having a viscosity at 25° C. of 10 to 100 mPa·s, and component (A-2) is suitably an alkenyl group-containing organopolysiloxane having a viscosity at 25° C. of 10,000 mPa·s or more, and the viscosity at 25° C. of these mixed polymers is within the range of 1.15 to 5.5 times the viscosity at 25° C. of component (A-1).

In the present invention, it is necessary that each composition stored individually does not simultaneously contain component (A), component (B), and component (C). This is because when component (A), component (B), and component (C) are blended simultaneously, cross-linking reaction starts spontaneously and the storage stability of the composition is lost in a short period of time, and the long-term storage stability and handleability, which are the objectives of multi-component compositions, cannot be realized.

In the present invention, including at least liquid (I) and liquid (II) means that the composition is an individually stored composition and is a multicomponent composition made up of a plurality of compositions, including at least two different compositions as defined below, and is not particularly restricted as long as the composition is made up of two or more components stored individually. These components are preferably packaged in a container when stored individually, and are coated or applied after being mixed in a common container at the time of use using a mixer or other mechanical force, or using a dispenser or the like capable of mixing a plurality of components. From the standpoint of handleability of the composition and simplicity of mixing operation, the multi-component thermally conductive silicone gel composition of the present invention is preferably a two-component thermally conductive silicone gel composition substantially made up of the following liquid (I) and liquid (II).

[Liquid (I): Composition Containing Alkenyl Group-Containing Organopolysiloxane]

Liquid (I):
- is the base compound of the composition;
- is a composition containing an alkenyl group-containing organopolysiloxane;

must contain said components (A-1), (A-2), (C), (D), (E) and (F);
must not contain component (B); and
may optionally contain component (G) or other components.

[Liquid (II): Composition Containing Organohydrogenpolysiloxane]

Liquid (II):
is a composition containing an organohydrogenpolysiloxane, which is a cross-linking agent of the composition;
must contain said components (A-1), (A-2), (B), (D), (E), and (F);
must not contain component (C); and
may optionally contain component (G) or other components. It may optionally not contain components (A-1) and (A-2).

The composition of the present invention contains a large amount of thermally conductive filler as an entire composition in order to achieve a high thermal conductivity, and the content of component (D) in these liquid (I) and liquid (II) is preferably in the range of 80 to 98% by mass of the entire respective compositions from the viewpoint of uniformly mixing both liquids. If, in order to resolve the problem of separation, an approach is taken to simply reduce the content of component (D) in the composition containing the organohydrogenpolysiloxane, which is a crosslinking agent (liquid (II)), and if a large amount of thermally conductive filler is added to the liquid (I) to compensate, after including the large amount of thermally conductive filler, the thermal conductivity of the composition as a whole will be 2.0 W/mK or more, suitably 3.5 W/mK or more, and more suitably 4.0 W/mK or more. Furthermore, if only the content of the thermally conductive filler in the liquid (II) is reduced, the viscosity and liquidity of the liquid (I) and the liquid (II) of each composition will be extremely different, and mixing them uniformly as a multi-component thermally conductive silicone gel composition using a simple method such as a mixer or a dispenser at the time of use will be difficult, resulting in dramatic deterioration of handleability.

The multi-component thermally conductive silicone gel composition of the present invention can be designed to contain a large amount of thermally conductive filler, both as the composition as a whole and as each composition which is the liquid (I) and liquid (II) described above, with no loss of thermal conductivity and handleability of the composition as a whole and achieving long term storage stability. Furthermore, the multi-component thermally conductive silicone gel composition of the present invention does not cause poor dispersion of the components when mixing liquid (I) and liquid (II) using a static mixer or the like; therefore, the entire composition after mixing maintains stable and high fluidity, and therefore, has precision coating and superior gap fill properties for electronic components having many gaps. In addition, the viscosity and thixotropy of the composition before curing and after mixing, and the peelability and repairability of the thermally conductive silicone gel after curing can be adjusted as desired, and a composition design with superior vertical retention and silicone gel repairability during coating is feasible.

As described above, the multi-component thermally conductive silicone gel composition of the present invention is used by mixing a plurality of individually stored compositions, including liquid (I) and liquid (II), for use thereof. As the mixing method, examples include introducing each component of the multi-component thermally conductive silicone gel composition into a mechanical mixing device (for example, a general-purpose mixer such as a static mixer) using a measuring pump from a storage container and mixed for use or loading of a package of each component into a dispenser enabling squeezing out a certain amount or volume ratio of each component for mixing. When each component of the multi-component thermally conductive silicone gel composition is mixed in an open system mixer, the mixture may be and is preferably used after a de-foaming operation. The liquid (I) and the liquid (II) included in the multi-component thermally conductive silicone gel composition of the present invention have excellent long-term storage stability, do not cause separation problems, and can be uniformly mixed using a simple method, such that handleability is extremely superior.

The components of the multi-component thermally conductive silicone gel composition of the present invention are described below.

[(A) Alkenyl Group-Containing Organopolysiloxane]

The alkenyl group-containing organopolysiloxane, which is component (A), is made up of:
(A-1) an alkenyl group-containing organopolysiloxane having a degree of polymerization of siloxane in the range of 5 to 100; and
(A-2) an alkenyl group-containing organopolysiloxane having a degree of polymerization of siloxane of 400 or more. Here, the degree of polymerization of siloxane is the number of siloxane units calculated from the number average molecular weight of organopolysiloxane obtained using NMR.

The alkenyl group-containing organopolysiloxane, which is component (A-1), is the base compound of the thermally conductive silicone gel composition, and has a degree of polymerization of siloxane in the range of 5 to 100, and suitably has a viscosity at 25° C. in the range of 10 to 100 mPa-s. The viscosity of component (A-1) at 25° C. is preferably in the range of 10 to 100 mPa-s. If the degree of polymerization of component (A-1) is less than the lower limit described above, or if the viscosity of component (A-1) is less than 10 mPa-s, the physical properties of the resulting silicone gel tend to be degraded. On the other hand, if the degree of polymerization of component (A-1) exceeds the upper limit, and in particular, if the viscosity of component (A-1) exceeds 100 mPa-s, the extrudability of the resulting silicone gel composition and the mixability with a static mixer or the like tend to be reduced.

The alkenyl group-containing organopolysiloxane that is component (A-2) is a separation inhibitor for component (A-1), is the base compound of the thermally conductive silicone gel composition, and has a degree of polymerization of siloxane of 400 or more, and suitably has a high viscosity at 25° C. of 10,000 mPa-s or more. The viscosity of component (A-2) at 25° C. may be in the range of 10,000 to 10,000,000 mPa-s, and component (A-2) may be a gum-like alkenyl group-containing organopolysiloxane having plasticity. Specifically, the component may be a raw rubber-like alkenyl group-containing organopolysiloxane having a viscosity of 10,000 mPa-s or more at 25° C., or a plasticity in the range of 50 to 200 as measured according to the method specified in JIS K6249. Further, the viscosity at 25° C. is suitably in the range of 10 to 100,000 times that of (A-1). If the viscosity of component (A-2) at 25° C. is less than 10 times that of (A-1), separation of component (A-1) may not be effectively prevented. From the viewpoint of overall viscosity, the viscosity of component (A-2) at 25° C. may be in the range of 10,000 to 50,000 mPa-s. The content of component (A-2) contained in the product is an amount that sets the viscosity of the mixture of component (A-1) and component (A-2) to 1.15 to 5.5 times the viscosity of component (A-1), preferably 1.2 to 5.25 times the viscosity of component (A-1), more preferably 1.2 to 3.0, and particularly preferably 1.2 to 2.0 times. Here, the viscosity of the mixture of component (A-1) and component (A-2) can be calculated not only from actual measurements but also from the blend chart of the oil provided by the silicone manufacturer, or viscosity [A-1][A-2] can be read by plotting the viscosities of the low-viscosity oil and the high-viscosity oil at both ends and connecting the lines. If the viscosity [A-1][A-2]/viscosity [A-1] is 1.15 or less, the effect of component (A-2) cannot be obtained, and if it exceeds 5.5, a decrease in dischargeability beyond the expected effect occurs. From the viewpoint of dischargeability, the degree[sic] [A-1][A-2]/viscosity [A-1] must be in the range of 1.15 to 5.5 and is particularly suitably set to 1.20 to 2.0. In particular, a combination of component (A-1) and component (A-2) in which the overall viscosity after mixing of component (A-1) and component (A-2) is 200 mPa-s or less, and more suitably, 150 mPa-s or less, may be suitably used.

Component (A) is formed by one or two or more alkenyl group-containing organopolysiloxanes. The molecular structure of such an alkenyl group-containing organopolysiloxane is not particularly limited, with examples thereof including straight-chain, branched, cyclic, three-dimensional network structures, and combinations thereof. Component (A) may consist only of a straight-chain alkenyl group-containing organopolysiloxane or an alkenyl group-containing organopolysiloxane having a branched structure; alternatively, it may be formed from a mixture of a straight-chain alkenyl group-containing organopolysiloxane and an alkenyl group-containing organopolysiloxane having a branched structure. Moreover, exemplary alkenyl groups in the molecule include vinyl groups, allyl groups, butenyl groups, hexenyl groups, etc. Moreover, exemplary organic groups other than alkenyl groups in component (A) include: alkyl groups such as methyl groups, ethyl groups, and propyl groups; aryl groups such as phenyl groups and tolyl groups; and monovalent hydrocarbon groups other than alkenyl groups such as halogenated alkyl groups such as 3,3,3-trifluoropropyl groups.

In particular, component (A) is a straight-chain alkenyl group-containing organopolysiloxane, preferably containing alkenyl groups at least at both ends of the molecular chain, and it is acceptable to only have alkenyl groups at both molecular terminals. While not particularly limited, examples of component (A) include: dimethylpolysiloxane capped at both molecular terminals with dimethylvinylsiloxy groups, copolymers of dimethylsiloxane and methylvinylsiloxane capped at both molecular terminals with dimethylvinylsiloxy groups, copolymers of dimethylsiloxane and methylphenylsiloxane capped at both molecular terminals with dimethylvinylsiloxy groups, copolymers of dimethylsiloxanes and methylvinylsiloxane capped at both molecular terminals with trimethylsiloxy groups, copolymers of dimethylsiloxane, methylvinylsiloxane, and methylphenylsiloxane capped at both molecular terminals with trimethylsiloxy groups, copolymers of dimethylsiloxane and methylvinylsiloxane capped at both molecular terminals with silanol groups; these polymers where a part of the methyl groups are ethyl groups, a polymer substituted with an alkyl group other than a methyl group, such as a propyl group, or a halogenated alkyl group such as a 3,3,3-trifluoropropyl group; and these polymers where the vinyl groups are allyl groups, polymer substituted with an alkenyl group other than a vinyl group such as a butenyl group or a hexenyl group, and mixtures of two or more of these polymers. Note that regarding these alkenyl group-containing organopolysiloxanes, in terms of preventing contact failure, etc., low molecular weight siloxane oligomers (octamethyltetrasiloxane (D4) and decamethylpentasiloxane (D5)) are preferably reduced or eliminated.

Component (A) of the present invention further has a silicon atom-bonded alkoxysilyl-containing group represented by the general formula:

[Formula 2]

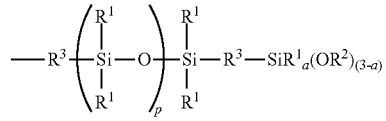

(wherein, $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50) The organopolysiloxane having these functional groups suppresses thickening of the composition in the uncured state, in addition to having alkoxysilyl groups in the molecule, allowing it to function as a surface treatment agent for component (D). As a result, it may be beneficial in suppressing thickening and oil bleeding of the obtained composition and not impairing handling workability.

[(B) Organohydrogenpolysiloxane]

Component (B) is a component of liquid (II) described above and is the main cross-linking agent of the thermally conductive silicone gel composition of the present invention and while an organohydrogenpolysiloxane having two or more silicon-bonded hydrogen atoms in the molecule can be used without restriction, from the viewpoint of the flexibility and vertical retention of the resulting thermally conductive silicone gel-cured product, the number (average value) of silicon-bonded hydrogen atoms in the organohydrogenpolysiloxane molecule preferably does not exceed 8.

[Amount of the Organohydrogenpolysiloxane (Crosslinking Agent) in the Composition]

For the composition of the present invention, from the viewpoint of the form of the obtained thermally conductive silicone gel-cured product and peelability and repairability of the cured product, relative to 1 mol of alkenyl group included in component (A), the amount of component (B) needs to be an amount that provides in the range of 0.2 to 5 mol and particularly preferably in the range of 0.3 to 2.0 mol or 0.4 to 1.0 mol of the silicon-bonded hydrogen atoms in component (B). Specifically, the content of the silicon-bonded hydrogen atoms in the component (B) being less than the lower limit described above may cause poor curing of the thermally conductive silicone gel composition, and if the content of the silicon-bonded hydrogen atoms exceeds the upper limit, the amount of the silicon-bonded hydrogen atoms may become excessive and the peelability and repairability of the cured product may be impaired.

[Suitable Crosslink Extender: Component (B1)]

From the viewpoint of the peelability and repairability of the thermally conductive silicone gel-cured product obtained by curing the composition according to the present invention, component (B) should at least contain (B1) a straight-chain organohydrogenpolysiloxane having a viscosity at 25° C. of 1 to 1,000 mPa-s and containing on average 2 to 4 silicon-bonded hydrogen atoms in the molecule, at least 2 of which are in the side molecular chain. The component (B1) structure described above means that the component (B1) functions as a crosslink extender in the present composition based on a hydrosilylation reaction of silicon-bonded hydrogen atoms on the molecular chain side chains.

In the thermally conductive silicone gel composition of the present invention, component (B1) functions as a crosslink extender of component (A) to slowly crosslink the entire composition to form a gel-like cured product. Here, component (B) has on average at least two silicon atom-bonding hydrogen atoms on the side molecular chain and contains on average only 2 to 4 silicon-bonded hydrogen atoms in the molecule so that the crosslink extension reaction proceeds primarily based on the 2 to 4 silicon atom-bonding hydrogen atoms on the side chain to form the thermally conductive silicone gel-cured product having superior peelability from the member and excellent repairability for repair and reuse.

From the viewpoint of improving peelability and repairability, component (B) is preferably (B1-1), a straight-chain organohydrogenpolysiloxane having on average 2 to 3 silicon-bonded hydrogen atoms in the molecule, at least two of which are in the side molecular chain, and (B1-1-1), an organohydrogenpolysiloxane having on average 2 to 3 silicon-bonded hydrogen atoms only in the molecular chain side chain. Component (B1) most preferably has an average of two silicon-bonded hydrogen atoms only in the side molecular chains.

Examples of component (B1) include: a methylhydrogen siloxane-dimethylsiloxane copolymer capped at both molecular terminals with trimethylsiloxy groups and a methylhydrogen siloxane-dimethylsiloxane copolymer capped at both molecular terminals with dimethylhydrogensiloxy groups. Note, these examples are non-limiting, and some of the methyl groups may be substituted with phenyl groups, hydroxyl groups, alkoxy groups, and the like.

While the viscosity of component (B1) at 25° C. is not particularly limited, it is preferably within a range of 1 to 500 mPa·s; and in terms of preventing contact failure, etc., the low molecular weight siloxane oligomer (octamethyltetrasiloxane (D4) and decamethylpentasiloxane (D5)) is preferably reduced or eliminated.

[Combination with Other Cross-Linking Agents]

Component (B) of the present invention can include: an organohydrogenpolysiloxane other than component (B1); a methylhydrogen siloxane-dimethylsiloxane copolymer capped at both molecular terminals with trimethylsiloxy groups containing, on average, more than four silicon-bonded hydrogen atoms in the molecule; a methylhydrogen siloxane-dimethylsiloxane copolymer capped at both molecular terminals with dimethylhydrogensiloxy groups containing, on average, more than four silicon-bonded hydrogen atoms in the molecule; methylhydrogenpolysiloxane capped at both molecular terminals with trimethylsiloxy groups; dimethylpolysiloxane capped at both molecular terminals with dimethylhydrogensiloxy groups; and methylhydrogensiloxy group-containing siloxane resin or the like may be included as a crosslinking agent. However, at least the amount of component (B1) described above is suitably included as a crosslink extender, and even when another organohydrogenpolysiloxane is used in combination, from the viewpoint of the curing properties of the composition of the present invention and the peelability and repairability of the cured product, the ratio of component (B1) is preferably at least a certain amount or more.

Specifically, for the content of the silicon-bonded hydrogen atoms ($[H_{B1}]$) in component (B1) and the content of the silicon atom-bonded hydrogen atoms in the organohydrogenpolysiloxane other than component (B1) ($[H_{non-B1}]$) in the composition, the value of $[H_{non-B1}]/([H_{B1}]+[H_{non-B1}])$ is preferably in the range of 0.0 to 0.70 and may be 0.0 to 0.50, 0.0 to 0.25, or 0.0. If the value of $[H_{non-B1}]/([H_{B1}]+[H_{non-B1}])$ exceeds the upper limit, the effect of component (B) on the overall crosslinking agent in the composition becomes relatively small, and may cause peelability and repairability of the cured product to be impaired or may cause curing defects.

From the viewpoint of the technical effect of the present invention, the following combinations of organohydrogenpolysiloxane, which is a crosslinking agent in the present composition, are suitable.

(B1): only component (B1), or substantially only component (B1), with no other organohydrogenpolysiloxane intentionally included in the composition (B'2): in addition to component (B1), an organohydrogenpolysiloxane mixture including one or more types selected from dimethylpolysiloxane capped at both molecular terminals with dimethylhydrogensiloxy groups, a methylhydrogen siloxane-dimethylsiloxane copolymer capped at both molecular terminals with trimethylsiloxy groups containing, on average, 5 to 8 silicon-bonded hydrogen atoms in the molecule, a methylhydrogen siloxane-dimethylsiloxane copolymer capped at both molecular terminals with dimethylhydrogensiloxy groups containing, on average, 5 to 8 silicon-bonded hydrogen atoms in the molecule;

however, even if component (B'2) described above is used, the value of $[H_{non-B1}]/([H_{B1}]+[H_{non-B1}])$ should be in the same range as above.

In particular, when the organohydrogenpolysiloxane in the composition is a mixture indicated in (B'2) above, in particular, a mixture with component (B1) and a dimethylpolysiloxane capped at both molecular terminals with dimethylhydrogensiloxy groups, from the viewpoint of improving the curability of the composition, the amount of mixture is preferably an amount that provides in the range of 0.5 to 1.5 mol, and more preferably in the range of 0.7 to 1.0 mol of silicon-bonded hydrogen atoms in the organohydrogenpolysiloxane in the mixture. On the other hand, when the organohydrogenpolysiloxane in the composition is substantially only component (B1), the amount of organohydrogenpolysiloxane is preferably an amount that provides 0.3 to 1.5 mol, more preferably 0.4 to 1.0 mol, of silicon-bonded hydrogen atoms in the composition. When the type and the content of the organohydrogenpolysiloxane in the composition are within said ranges, the flowability and gap fill properties of the thermally conductive silicone gel composition, which are technical effects of the present invention, are most excellent, and the physical properties of the thermally conductive silicone gel-cured product obtained are most favorable, and in addition, in particular, the peelability and the repairability are most favorable.

[(C) Hydrosilylation Reaction Catalyst]

The hydrosilylation reaction catalyst is a component of the liquid (I) described above, and examples include a platinum-based catalyst, a rhodium-based catalyst, and a palladium-based catalyst, and a platinum-based catalyst is preferred because a platinum-based catalyst can significantly promote curing of the composition. Exemplary platinum-based catalysts include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex particularly preferable. Exemplary alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. In particular, 1,3-divinyl-1,1,3,3-tetramethyldisiloxane is preferable because the platinum-alkenyl siloxane complex has good stability. In addition, in terms of improving the handleability as well as the pot life of the composition, a platinum containing hydrosilylation reaction catalyst in fine particles dispersed and encapsulated with thermoplastic resin may be used. As the catalyst for promoting the hydrosilylation reaction, a non-platinum based metal catalyst such as iron, ruthenium, iron/cobalt, or the like may be used.

The amount of the hydrosilylation reaction catalyst to be added is a catalytic amount and preferably an amount in which the metal atom is within a range of 0.01 to 500 ppm, an amount within a range of 0.01 to 100 ppm, or an amount within a range of 0.01 to 50 ppm in terms of mass units with regard to component (A).

[Hydrosilylation Reaction Inhibitor]

The composition according to the present invention preferably further contains a hydrosilylation reaction inhibitor in terms of the handling workability thereof. The hydrosilylation reaction inhibitor is a component for suppressing the hydrosilylation reaction of the thermally conductive silicone gel composition according to the present invention, with specific examples thereof including reaction inhibitors such as acetylene types (such as ethynyl cyclohexanol), amine types, carboxylic acid ester types, and phosphite ester types. The addition amount of the reaction inhibitor is typically 0.001 to 5% by mass of the total silicone gel composition. Acetylenic compounds such as 3-methyl-1-butyn-3-ol, 3,5-dimethyl-1-hexyne-3-ol, and 3-phenyl-1-butyne-3-ol, enyne compounds such as 3-methyl-3-pentene-1-yne and 3,5-dimethyl-3-hexene-1-yne, cycloalkenylsiloxanes such as 1,3,5,7-tetramethyl-1,3,5,7-tetravinylcyclotetrasiloxane, and 1,3,5,7-tetramethyl-1,3,5,7-tetrahexenylcyclotetrasiloxane, and triazole compounds such as benzotriazole can be particularly used without any limitation in order to improve the handleability of silicone gel compositions.

[(D) Thermally Conductive Filler]

Component (D) is a component common to liquid (I) and liquid (II) described above, and is a thermally conductive filler for imparting thermal conductivity to the composition and thermally conductive member made using the cured composition. This manner of component (D) is preferably a powder and/or a fiber of at least one or more selected from the group consisting of a pure metal, an alloy, a metal oxide, a metal hydroxide, a metal nitride, a metal carbide, a metal silicide, a carbon, a soft magnetic alloy, and a ferrite. Of these, a metallic powder, a metal oxide powder, a metal nitride powder, or carbon powder is suitable.

This manner of thermally conductive filler is preferably surface treated in whole or in part with alkoxysilane, which is component (E) described below. Furthermore, separate from or together with component (E), these powders and/or fibers may be treated with various surface treatment agents known as coupling agents. Surface treatment agents for treating the powders and/or fibers of component (D) include: surfactants, other silane coupling agents, aluminum-based coupling agents, and silicone-based surface treatment agents, in addition to component (E).

Pure metals include: bismuth, lead, tin, antimony, indium, cadmium, zinc, silver, copper, nickel, aluminum, iron and silicon metal. Alloys include: an alloy including two or more metals selected from the group consisting of bismuth, lead, tin, antimony, indium, cadmium, zinc, silver, aluminum, iron and silicon metal. Metal oxides include: alumina, zinc oxide, silicon oxide, magnesium oxide, beryllium oxide, chromium oxide and titanium oxide. Metal hydroxides include: magnesium hydroxide, aluminum hydroxide, barium hydroxide, and calcium hydroxide. Metal nitrides include: boron nitride, aluminum nitride and silicon nitride. Metal carbides include: silicon carbide, boron carbide and titanium carbide. Metal silicides include: magnesium silicide, titanium silicide, zirconium silicide, tantalum silicide, niobium silicide, chromium silicide, tungsten silicide and molybdenum silicide. Carbons include: diamond, graphite, fullerene, carbon nanotubes, graphene, activated carbon and amorphous carbon black. Soft magnetic alloys include: Fe—Si alloy, Fe—Al alloy, Fe—Si—Al alloy, Fe—Si—Cr alloy, Fe—Ni alloy, Fe—Ni—Co alloy, Fe—Ni—Mo alloy, Fe—Co alloy, Fe—Si—Al—Cr alloy, Fe—Si—B alloy, and Fe—Si—Co—B alloy. Ferrites include: Mn—Zn ferrite, Mn—Mg—Zn ferrite, Mg—Cu—Zn ferrite, Ni—Zn ferrite, Ni—Cu—Zn ferrite and Cu—Zn ferrite.

Component (D) is suitably silver powder, aluminum powder, aluminum oxide powder, zinc oxide powder, aluminum nitride powder or graphite. When electrical insulation is required for the present composition, a metal oxide powder or a metal nitride powder is preferable, and in particular, aluminum oxide powder, zinc oxide powder, or aluminum nitride powder is preferable.

The shape of component (D) is not particularly limited and includes, for example, a spherical shape, a needle shape, a disk shape, a rod shape, and an irregular shape, and is preferably a spherical shape or an irregular shape. The average particle diameter of component (D) is not particularly limited, but is preferably in the range of 0.01 to 500 µm, and more preferably in the range of 0.01 to 300 µm.

Component (D) is particularly preferably:
(D1) a plate-shaped boron nitride powder having an average particle diameter of 0.1 to 150 µm;
(D2) a granular or spherically compacted boron nitride powder having an average particle diameter of 0.1 to 500 µm;
(D3) a spherical melt-solidified and/or crushed aluminum oxide powder with an average particle diameter of 0.01 to 50 µm; or
(D4) spherical and/or crushed graphite having an average particle diameter of 0.01 to 50 µm, or
a mixture of two or more of these. One example of a suitable component (D) is a mixture of two or more types of spherical and crushed aluminum oxide powders having an average particle diameter of 0.01 to 50 µm. In particular, the combination of aluminum oxide powders with large particle size and small particle size in the ratio following the maximum packing theoretical distribution curve improves the packing efficiency and enables low viscosity and high thermal conductivity.

The content of component (D) is in the range of 600 to 3,500 parts by mass for 100 parts by mass of component (A-1) in the entire composition for each of liquid (I) and liquid (II), and preferably in the range of 1,200 to 3,000 parts by mass. That is, as an entire composition, the sum of component (D) in liquid (I) and liquid (II) is in the range of 1,200 to 7,000 parts by mass, and said sum may be in the range of 2,400 to 6,000 parts by mass, and may be in the range of 2,400 to 5,500 parts by mass. This is because, if the content of component (D) is less than the lower limit of the above range, the thermal conductivity of the resulting composition will be less than 2.0 W/mK while, if the content of component (E) exceeds the upper limit of the above range, even when component (E) is blended or used for surface treatment of component (D), the viscosity of the resulting composition is remarkably high, and the handleability, gap fill properties, and the like are reduced.

The composition of the present invention has a thermal conductivity of 2.0 W/mK or more, and the content of component (D) is preferably in the range of 80 to 98% by mass of the entire composition, more preferably in the range of 82 to 95% by mass, and particularly preferably in the range of 85 to 95% by mass. If within the range described above, a thermally conductive silicone gel composition can be designed that achieves a thermal conductivity of 2.0 W/mK or more, suitably 3.5 W/mK or more, more suitably 4.0 W/mK or more, and particularly suitably 5.0 W/mK or more, while maintaining excellent gap fill properties and flowability, which are the objects of the present invention.

[Other Inorganic Fillers]

The composition of the present invention contains, as optional ingredients, inorganic fillers such as fumed silica, wet-produced silica, crushed quartz, titanium oxide, magnesium carbonate, zinc oxide, iron oxide, diatomaceous earth, carbon black, and the like, and blending in of inorganic fillers in which the surface of such inorganic fillers is hydrophobically treated with organic silicon compounds (silazanes, and the like) does not fully inhibit; however, from the viewpoint of achieving both high thermal conductivity and high gap fill properties, filler other than component (D) is preferably not substantially contained. In particular, when reinforcing fillers having a broad BET specific surface area, such as reinforcing silicas, are blended into the present composition, achieving the rheological properties characteristic of the present invention by blending into the composition an amount of component (D) that imparts a thermal conductivity of 3.5 W/km or more may be difficult. The term "substantially does not include" means that the content of the filler other than the component (D) in the composition is preferably less than 1% by mass, and more preferably less than 0.5% by mass. Most suitably, the intentional addition of a filler other than component (D) is 0.0% by mass in the composition.

[Surface Treatment of Component (D)]

The composition contains a specific amount of two types of surface treatment agents with different chemical structures: component (E) and component (F). Specifically, taking the entire component (D) of the present invention as 100% by mass, these components are preferably blended in a range of 0.1 to 5.0% by mass, and component (D) is preferably surface treated using these components. Although the surface treatment process of component (D) is optional, from the viewpoint of improving flowability, gap fill properties, and thixotropic properties of the composition, a process in which in particular, at least a portion of component (D) is surface treated by component (E), followed by surface treatment of component (D) by component (F), is suitably exemplified.

[(E) One or More Silane Coupling Agents or Hydrolytic Condensation Products Thereof]

Component (E) is a surface treatment agent for component (D), a common structural component of liquid (I) and liquid (II) described above, and a component that improves the blend amount of component (D) and the viscosity and flowability of the overall composition. Known silane coupling agents or hydrolytic condensation products thereof may be used for such component (E) without any particular limitation, but component (E1), an alkoxysilane having an alkyl group having six or more carbon atoms in the molecule, as described below, is in particular suitably included.

The silane coupling agent, which is component (E), has the general formula:

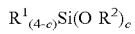

$$R^1_{(4-c)}Si(O\,R^2)_c$$

In the formula, $R^1$ is a monovalent hydrocarbon group, an epoxy group-containing organic group, a methacryl-containing organic groups, or an acryl-containing organic group. Examples of the monovalent hydrocarbon group of $R^1$ include: straight-chain alkyl groups such as methyl groups, ethyl groups, propyl groups, butyl groups, hexyl groups, and decyl groups; branched-chain alkyl groups such as isopropyl groups, tertiary butyl groups, and isobutyl groups; cyclic alkyl groups such as cyclohexyl groups; alkenyl groups such as vinyl groups, allyl groups, butenyl groups, pentenyl groups, hexenyl groups, and heptenyl groups; aryl groups such as phenyl groups, tolyl groups, and xylyl groups; aralkyl groups such as benzyl groups and phenethyl groups; halogenated alkyl groups such as 3,3,3-trifluoropropyl groups, 3-chloropropyl groups; and substituted or unsubstituted monovalent hydrocarbon groups. Examples of the epoxy-containing organic group of R4 include: glycidoxyalkyl groups such as 3-glycidoxypropyl groups and 4-glycidoxybutyl groups; and epoxycyclohexyl alkyl groups such as 2-(3,4-epoxycyclohexyl) ethyl groups, and 3-(3,4-epoxycyclohexyl)propyl groups. Also, examples of $R^1$ methacryl-containing organic groups include methacryloxyalkyl groups such as 3-methacryloxypropyl groups and 4-methacryloxybutyl groups. Furthermore, examples of the acryl-containing organic group of $R^1$ include acryloxyalkyl groups such as 3-acryloxypropyl groups and 4-acryloxysibutyl groups.

$R^2$ is an alkyl group, and examples include alkoxyalkyl groups, alkenyl groups, and acyl groups. Examples of the alkyl group of $R^2$ include straight-chain alkyl groups, branched-chain alkyl groups, and cyclic alkyl groups as described above; as the alkoxyalkyl group of $R^2$, examples include methoxyethyl groups and methoxypropyl groups; as the alkenyl group of $R^2$, examples include: vinyl groups, allyl groups, butenyl groups, pentenyl groups, and hexenyl groups; and as the acyl group of R2, examples include acetyl groups and octanoyl groups.

The integer c is an integer from 1 to 3, preferably 3.

Other than component (E1), examples of component (E) include: methyltrimethoxysilane, methyltriethoxysilane, ethyltrimethoxysilane, n-propyltrimethoxysilane, butyltrimethoxysilane, pentyltrimethoxysilane vinyltrimethoxysilane, vinyltriethoxysilane, methylvinyldimethoxysilane, allyltrimethoxysilane, allylmethyldimethoxysilane, butenyltrimethoxysilane, 3-glycidoxypropyltrimethoxysilane, 3-glycidoxypropylmethyldimethoxysilane, 3-glycidoxypropyltriethoxysilane, 3-methacryloxypropyltrimethoxysilane, 3-methacryloxypropyltriethoxysilane, 3-methacryloxypropylmethyldimethoxysilane, 3-acryloxypropyltrimethoxysilane, and 3-acryloxypropylmethyldimethoxysilane.

[(E1) Alkylalkoxysilane]

Component (E1) is a suitable component in this composition together with component (B1), and is an alkoxysilane having an alkyl group with 6 or more carbon atoms in the molecule. Specific examples of the alkyl group having 6 or more carbon atoms include: alkyl groups such as hexyl groups, octyl groups, dodecyl groups, tetradecyl groups, hexadecyl groups, and octadecyl groups; and aralkyl groups such as benzyl groups and phenylethyl groups, and in particular, alkyl groups having 6 to 20 carbon atoms. In the case of an alkoxysilane having an alkyl group with less than 6 carbon atoms, the effect of reducing the viscosity of the composition is insufficient, and the viscosity of the composition may increase causing the desired flowability and gap fill properties to not be achieved. When alkoxysilane having an alkyl group with 20 or more carbon atoms, or the like is used, the industrial supply-ability thereof is inferior and, depending on the type of component (A), miscibility may be reduced.

Suitably, component (E1) is an alkoxysilane represented by the structural formula:

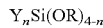

(In the formula, Y is an alkyl group having 6 to 18 carbon atoms, R is an alkyl group having 1 to 5 carbon atoms, and n is a number being 1 or 2), and examples of the OR group include: a methoxy group, an ethoxy group, a propoxy group, a butoxy group, and the like, and a methoxy group and a ethoxy group are particularly preferred.

In addition, the number n is 1, 2 or 3, and it is particularly preferred that n is 1.

Examples of this component (E1) include:
$C_6H_{13}Si(OCH_3)_3$, $C_8H_{17}Si(OC_2H_5)_3$, $C_{10}H_{21}Si(OCH_3)_3$, $C_{11}H_{23}Si(OCH_3)_3$, $C_{12}H_{25}Si(OCH_3)_3$, $C_{14}H_{29}Si(OC_2H_5)_3$, and the like, and most suitably decyltrimethoxysilane.

Component (E) of the present invention preferably includes component (E1) described above. Specifically, component (E1) alone, or a mixture of component (E1) and other silane coupling agents. If desired, only silane coupling agents other than component (E1) may be used, and some or all of these silane coupling agents may be used in an already-hydrolyzed form.

[(F) Polysiloxane-Type Surface Treatment Agent Having a Hydrolyzable Silyl Group at One End of the Molecular Chain]

Component (F) is a component common to liquid (I) and liquid (II), and unlike component (E), is a surface treatment agent having a hydrolyzable silyl group at one end of the molecular chain and a polysiloxane structure, and is used to treat component (D) in combination with component (E), or suitably, after surface treatment with component (E). Also, subsequent surface treatment with component (F) can provide a thermally conductive silicone gel composition where the flowability, gap fill properties, and thixotropy of the composition are improved even when a large amount of thermally conductive filler, which is component (D), is blended in.

Specifically, component (F) is an organopolysiloxane having a hydrolyzable silyl group at the end of the molecular chain, and although the structure is not particularly restricted, such component (F) is an organopolysiloxane represented by the following general formula (1) or general formula (2), or a mixture thereof.

(i) An organopolysiloxane represented by General Formula (1):

[Formula 3]

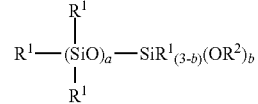

(In the formula, $R^1$ are independent unsubstituted or substituted monovalent hydrocarbon groups, and $R^2$ are independent hydrogen atoms, alkyl groups, alkoxyalkyl groups, or acyl groups, a is an integer from 5 to 250, and b is an integer from 1 to 3), with a viscosity of 10 to less than 10,000 mPa·s at 25° C.

(ii) An organopolysiloxane represented by General formula (2):

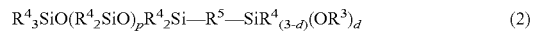

(In the formula, $R^4$ is the same or different monovalent hydrocarbon groups, $R^5$ is an oxygen atom or a divalent hydrocarbon group, $R^3$ is the same group as described above, p is an integer from 100 to 500, and d is the same integer as described above.)

(i) Component (F) represented by the General Formula (1) has a hydrolyzable silyl group at one end of the molecular chain. By using component (F) as a surface treatment agent of component (D), the flowability, gap fill properties, and thixotropy properties of the composition can be improved without degrading handleability and formability even when a large amount of component (D) is blended in, providing a thermally conductive silicone gel composition having superior vertical retention properties and imparting favorable adhesion to a substrate with which the composition is in contact during the curing process. In General Formula (1), $R^1$ are independent unsubstituted or substituted monovalent hydrocarbon groups, examples of which include: straight-chain alkyl groups, branched-chain alkyl groups, cyclic alkyl groups, alkenyl groups, aryl groups, aralkyl groups, and alkyl halide groups. Examples of a straight-chain alkyl group include: a methyl group, an ethyl group, a propyl group, a hexyl group, and an octyl group. Examples of a branched-chain alkyl group include: an isopropyl group, an isobutyl group, a tert-butyl group, and a 2-ethylhexyl group. Examples of a cyclic alkyl group include a cyclopentyl group and a cyclohexyl group. Examples of an alkenyl group include a vinyl group and an allyl group. Examples of an aryl group include a phenyl group and a tolyl group. Examples of an alkyl group include a 2-phenylethyl group and a 2-methyl-2-phenylethyl group. Examples of a halogenated alkyl group include: a 3,3,3-trifluoropropyl group, a 2-(nonafluorobutyl)ethyl group, and a 2-(heptadecafluorooctyl) ethyl group. $R^1$ is preferably a methyl group or a phenyl group.

In General Formula (1), $R^2$ are independent hydrogen atoms, alkyl groups, alkoxyalkyl groups, alkenyl groups, or acyl groups. Examples of an alkyl group include: a straight-chain alkyl group, a branched-chain alkyl group, and a cyclic alkyl group similar to the examples for $R^1$. Examples of an alkoxyalkyl group include a methoxyethyl group and a methoxypropyl group. Examples of an acyl group include an acetyl group and an octanoyl group. $R^2$ is preferably an alkyl group, and is particularly preferably a methyl group or an ethyl group.

In General Formula (1), a is an integer in the range of 5 to 250, preferably in the range of 10 to 200. Also, b is an integer from 1 to 3, preferably 2 or 3.

(ii) Component (F) represented by General Formula (2) has a hydrolyzable silyl group bonded to one end of the molecular chain via an oxygen atom or a divalent hydrocarbon group such as an alkylene group. When used as a surface treatment agent of component (D), component (F) improves the flowability, gap fill properties, and thixotropy properties of the composition without degrading the handleability and formability even when a large amount of component (D) is blended in, enabling providing of a thermally conductive silicone gel composition having excellent vertical retention properties.

$R^4$ in the formula is the same or different type of monovalent hydrocarbon group, and similar to above, examples include: a straight-chain alkyl group, a branched-chain alkyl group, a cyclic alkyl group, an aryl group, an aralkyl group, an alkenyl group, and a halogenated alkyl group, preferably a straight-chain alkyl group, and particularly preferably a methyl group. $R^5$ in the formula described above is an oxygen atom or a divalent hydrocarbon group. Examples of the divalent hydrocarbon group of $R^5$ include: alkylene groups such as a methylene group, an ethylene group, a propylene group, an isopropylene group, or a butylene group; and alkylene oxyalkylene groups such as an ethylene oxyethylene group or an ethylene oxypropylene group. In particular, $R^5$ is preferably an oxygen atom. $R^3$ in the formula above is the same group as described above. The integer p in the formula above is an integer from 100 to 500, preferably an integer from 105 to 500, more preferably an integer from 110 to 500, and particularly preferably an integer from 110 to 200. Note that if p in the above formula is less than the minimum value of the range given above, including a large amount of component (D) for obtaining the thermally conductive silicone gel composition of the present invention tends to not be feasible, while if p exceeds the maximum value of the range given above, the molecular volume bound to the surface of component (D) increases too much, and similarly, including a large amount of component (D) in the composition tends to not be feasible. In addition, the integer d in the above formula is an integer from 1 to 3, preferably 3.

The total amount of component (E) and component (F) used is an amount that is 0.1 to 5.0% by mass of component (D), and may be an amount that is 0.1 to 4.0% by mass, or an amount that is 0.2 to 3.5% by mass. If the amount of these components used is less than the lower limit described above, the effect of reducing the viscosity of the composition may be insufficient. If the amount of component (E) and component (F) used exceeds the upper limit, the effect of viscosity reduction may be saturated, and further, the alkoxysilane may separate, and the storage stability of the composition may be reduced.

In the present invention, component (E) and component (F) are preferably blended in a form so as that component (D) is surface-treated by these components. Here, surface treatment of component (D) by component (E) and component (F) may be simultaneous, or surface treatment of at least a portion of component (D) by either component may be followed by further surface treatment of component (D) by the other component.

The surface treatment method using component (E) and component (F) is common to both liquid (I) and liquid (II), and is not particularly limited, but a direct treatment method, an integral blend method, a dry concentrate method, or the like can be used for the thermally conductive inorganic filler that is component (D). Examples of a direct treatment method include the dry method, slurry method, spray method, and the like. Examples of an integral blend method include the direct method and master batch method and the like. Of these, the dry method, slurry method, and direct method are often used. Suitably, this can be in the form of all of component (D) and component (E) or a multi-step pre-mixing using a known mixing device to treat the surface thereof. As described in Patent Document 1 and Patent Document 2 above, a part of component (E) may be hydrolyzed or form a polymer on the surface of component (D), which is included in the concept of surface treatment of the present invention.

In the present invention, the surface treatment method using component (E) and component (F) is preferably a direct treatment method, and in particular, a heated surface treatment method in which component (D), component (E), and component (F) are mixed and heated (base heat) can be most suitably exemplified. Specifically, first, component (D) or a portion of component (D) are mixed with component (E) and optionally a portion of base compound component (A) or component (B); then component (F) is mixed with the remainder of component (D), and the mixture can be heated and stirred at 100 to 200° C., suitably under reduced pressure. The temperature conditions and stirring time can be designed according to the amount of sample, but are preferably in the range of 120 to 180° C. and from 0.25 to 10 hours.

In the present invention, for example, as proposed in Patent Document 3, the thermally conductive filler, which is component (D), may be surface treated with two or more treatment agents having different molecular weights as component (E), where the treatment agent having the larger molecular weight is added first and then the treatment agent having the smaller molecular weight is added later to perform surface treatment of component (D). However, selection of component (E1) is particularly beneficial in the process in that good flowability and gap fill properties can be achieved with only one stage of surface treatment, without the multi-step surface treatment described above. Also at this time, adding component (F) after the addition of component (E1) is suitable.

There is no particular limitation as to the mixing device described above, and examples include: single or double-shaft continuous mixers, double rolls, Ross mixers, Hobart mixers, dental mixers, planetary mixers, kneader mixers, Henschel mixers, and the like.

[Component (G)]

The composition of the present invention is made up of components (A) to (F), optionally additional cross-linking agents and hydrosilylation reaction inhibitors in the liquid (I) and liquid (II), but from the viewpoint of improving heat resistance of the thermally conductive silicone gel composition and cured product thereof after mixing, further containing (G) a heat resistance-imparting agent is preferable. Component (G) may be blended in one of either liquid (I) and liquid (II), or may be added as one independent component when the composition is designed to have three or more components. Component (G) is not particularly limited as long as it is capable of imparting heat resistance to the composition according to the present invention and the cured product thereof, with examples thereof including: metal oxides such as iron oxide, titanium oxide, cerium oxide, magnesium oxide, and zinc oxide; metal hydroxides such as cerium hydroxide; phthalocyanine compounds; cerium silanolate; cerium fatty acid salts; reaction products of an organopolysiloxane with a cerium carboxylic acid salt;

and the like. Particularly suitably, component (G) is a phthalocyanine compound, for example, an additive selected from the group consisting of a metal-free phthalocyanine compound and a metal-containing phthalocyanine compound disclosed in JP 2014-503680 W is suitably used, with copper phthalocyanine compounds particularly suitable among the metal-containing phthalocyanine compounds. One example of the most suitable and non-limiting heat resistance imparting agent is 29 H,31H-phthalocyaninato (2-)-N29,N30,N31,N32 copper. Such phthalocyanine compounds are commercially available, for example, Stan-tone (trademark) 40SP03 from PolyOne Corporation (Avon Lake, Ohio, USA.)

The blended amount of such component (G) may be within a range of 0.01 to 5.0% by mass of the total composition, or may be within a range of 0.05 to 0.2 mass % and 0.07 to 0.1 mass % thereof.

[Other Additives]

In addition to the components described above, the thermally conductive silicone gel composition of the present invention may have optional components blended in to the extent that the purpose of the present invention is not impaired. Examples of optional components include: an organopolysiloxane that does not contain a silicon-bonded hydrogen atom or a silicon-bonded alkenyl group, a cold resistance imparting agent, a flame retardant imparting agent, a pigment, a dye, and the like. In addition, the thermally conductive silicone gel composition of the present invention may, if desired, contain one or more antistatic agents made up of a known adhesive imparting agent, a cationic surfactant, an anionic surfactant, or a nonionic surfactant; a dielectric filler; an electrically conductive filler; a mold-releasing component; a thixotropic imparting agent; or an antifungal agent. If desired, an organic solvent may be added. These additives may be blended in either of liquids selected from liquid (I) and liquid (II), or may be added as one independent component when this composition is designed to have three or more components.

[Method for Manufacturing the Composition]

The thermally conductive silicone gel composition of the present invention can be prepared by mixing each of the components described above. For example, in the case of liquid (I), component (A-1), component (A-2), component (D), component (E), and component (F) are mixed in advance, and the surface of component (D) is treated with component (E) and component (F), and then preparation is feasible by mixing component (C) and component (G) if necessary, and any other components.

In the case of liquid (II), preparation is feasible by mixing component (A-1), component (A-2), component (D), component (E), and component (F) in advance, treating the surface of component (D) with component (E) and component (F), and then mixing component (B), and if necessary, component (G), and any other components. Preparation is also feasible by mixing component (D), component (E), and component (F) without using component (A-1) and component (A-2), treating the surface of component (D) with component (E) and component (F), and then mixing in component (B) and as-needed, component (G) as well as any other optional components. Further, in order to facilitate mixing of the optional component (G) and the hydrosilylation reaction inhibitor, mixing with component (A-1) and component (A-2) in advance and then blending in the form of a so-called master batch and blending with component (A-1) and component (A-2) as liquid (II) is feasible and is suitable.

Although the method for mixing each component may be a conventionally known method and is not particularly limited, a uniform mixture is generally made by simple stirring. Therefore, mixing using a mixing apparatus is preferable. While not particularly limited thereto, exemplary such mixing apparatuses may include a single or twin shaft continuous mixer, two rolls, Ross mixer, Hobart mixer, dental mixer, planetary mixer, kneader mixer, Henschel mixer, etc.

[Composition Form and Package]

The thermally conductive silicone gel composition of the present invention is a multi-component type (including a multi-liquid type, in particular a two-liquid type) in which the separate multi-components are mixed at the time of use, and a plurality of individually stored compositions can be mixed in a predetermined ratio for use. Note that while not particularly limited thereto, these packages can be selected as desired depending on the curing method, application means, and application object as described below.

[Curability]

The thermally conductive silicone gel composition of the present invention is cured by a hydrosilylation reaction to form a silicone gel cured product having superior thermal conductivity. The temperature conditions for curing this hydrosilylation reaction-cured type silicone gel composition are not particularly limited, but are usually in the range of 20° C. to 150° C., and more preferably in the range of 20° C. to 80° C. If desired, curing may be performed in a short time at a high temperature, or curing may be performed over a long time (for example, several hours to several days) at a low temperature such as room temperature, and there are no particular limitations.

The silicone gel cured product of the present invention preferably satisfies the range of 2 to 70 on a Type E hardness tester as specified in JIS K6249, and even more preferably satisfies the range of 2 to 50.

A silicone gel cured product with a hardness in these ranges will have the characteristics of silicone gels, such as low elastic modulus and low stress. On the other hand, if the hardness is greater than 70, although the adhesiveness with the heat generating member is superior, there is a risk that the followability may deteriorate, and if the hardness is less than 2, although the followability is excellent, there is a risk that the secure-ability of the heat generating member may become poor.

[Thermal Conductivity]

The thermally conductive silicone gel composition of the present invention can be stably highly filled with a thermally conductive filler and has a thermal conductivity of 2.0 W/mK or more, suitably 3.5 W/mK or more, more suitably 4.0 W/mK or more, and particularly suitably 5.0 W/mK. With the thermally conductive silicone gel composition of the present invention, compositions and silicone gel cured products with 4.0 to 7.0 W/mK can be designed and the gap fill properties described above can be achieved.

[Applications and Heat Dissipation Structures]

The thermally conductive silicone gel composition of the present invention is useful as a heat transfer material (thermally conductive member) to be interposed at the interface between a thermal boundary surface of a heat-generating component and a heat dissipating member such as a heat sink or a circuit board for cooling of the heat-generating component by heat conduction, and a heat dissipating structure can be formed with the composition. Although the type, size, and detailed structure of the heat-generating component are not particularly limited, the thermally conductive silicone gel composition of the present invention has excellent gap fill properties regarding members while having high thermal conductivity, high adhesiveness and followability to a heat-generating component having minute irregularities and a narrow gap structure, and high gel characteristic flexibility, and is therefore suitably applied to heat dissipating structures of electric and electronic devices including electric and electronic components and cell-type secondary batteries.

Although the structure of such a heat dissipating structure is not particularly limited, an example is a heat dissipation structure with a heat dissipating member provided via a thermally conductive silicone gel composition or cured product thereof on a heat dissipating component or a circuit board on which this heat dissipating component is mounted. An example of this type of structure is an electronic component, which is a heat-dissipating component, mounted on a circuit board, and heat generated from the electronic component is dissipated by a heat dissipating member through a thin film layer of the thermally conductive silicone gel composition or cured product thereof, and where these members are arranged in a horizontal direction and the thin film layer of the thermally conductive silicone gel or cured product thereof is sandwiched vertically between the circuit board and the heat-dissipating member. The circuit on the circuit board and the electronic components may be electrically connected, and the circuit board may have via holes formed in order to efficiently transfer heat generated by the electronic components.

In this manner of heat dissipating structure, the thermally conductive silicone gel composition or cured product thereof is sandwiched by the circuit board and the heat dissipating member, and although the thickness thereof is not particularly limited, the thickness can be in the range of 0.1 to 2 mm without falling off, and the heat generated from the electronic components in which the composition is filled without gaps can be efficiently transmitted to the heat-dissipating member.

Electrical and electronic devices equipped with a member made up of the thermally conductive silicone composition are not particularly limited, but include: for example, secondary batteries such as cell-based lithium-ion electrode secondary batteries and cell-stack fuel cells; electronic circuit boards such as printed circuit boards; IC chips packaged with optical semiconductor elements such as diodes (LEDs), organic electric field element (organic EL), laser diodes and LED arrays; CPUs used in electronic devices such as personal computers, digital video disks, mobile phones, and smartphones; and LSI chips such as driver ICs and memory, and the like. In particular, in high performance digital switching circuits formed with high integration density, heat removal (heat dissipation) is a major factor in the performance and reliability of the integrated circuits. Thermally conductive members made of the thermally conductive silicone gel composition of the present invention has superior heat dissipation and handleability when applied to power semiconductor applications such as engine control, power train systems, and air conditioner control in transportation equipment, and can also achieve superior heat resistance and thermal conductivity when incorporated into in-vehicle electronic components such as electronic control units (ECU) and used in a harsh environment.

In particular, by controlling the rheology thereof, the thermally conductive silicone gel composition of the present invention can be suitably placed not only on a horizontal surface but also on an inclined surface or a vertical surface, and can penetrate into the microstructure of heat-generating components such as electrical and electronic components and secondary batteries to provide a heat dissipating structure without gaps. Therefore, shifting or falling does not readily occur even if placed vertically in a severe temperature environment and thus is suitable as a heat dissipating member and protecting material of automotive control units. In addition, the heat dissipation characteristics of electrical and electronic equipment equipped with said heat dissipating structure is improved, the problems of latent heat and thermal runaway are improved, and a part of the structure of the electrical and electronic equipment is protected by the flexible gel-like cured product, which may improve the reliability and operational stability thereof.

The materials that make up the electrical and electronic devices described above include, for example, resins, ceramics, glass, and metals such as aluminum. The thermally conductive silicone gel composition of the present invention can be applied for use to these base materials both as a thermally conductive silicone gel composition (fluid) before curing and as a thermally conductive silicone cured product.

[Curing Method]

With regards to a heat-generating component, the method of forming a heat dissipating structure using the thermally conductive silicone gel composition of the present invention is not limited. For example, the thermally conductive silicone gel composition of the present invention is poured into a heat-dissipating portion of an electric or electronic component such that a gap is sufficiently filled, and then the composition is heated or left at room temperature to cure the composition.

For applications where rapid curing is required, the method of heating and curing is preferred, particularly because the entire product can be cured relatively quickly. Since a higher heating temperature promotes the generation of bubbles and cracks in the electrical and electronic component encapsulant being encapsulated or filled, heating at a temperature within a range of 50 to 250° C. is preferable and heating in a temperature within a range of 70 to 130° C. is particularly preferable. In the case of heat curing, from the viewpoint of handleability, a platinum-containing hydrosilylation reaction catalyst in the form of fine particles dispersed or encapsulated in a thermoplastic resin may be used.

On the other hand, the thermally conductive silicone gel composition of the present invention can be cured at room temperature or with heating at 50° C. or less. In this case, after mixing, the product is preferably cured over a period of one hour to several days at room temperature or at a temperature below 50° C.

The shape, thickness, arrangement, and the like of the thermally conductive silicone gel obtained by the above curing can be designed as desired, and may be cured as necessary after filling the gaps of electrical and electronic devices. The composition may be applied or cured on a film provided with a release layer (separator) and handled alone as a thermally conductive silicone gel-cured product on a film. In such cases, the sheet may be in the form of a thermally conductive sheet reinforced using a known reinforcing material.

[Specific Examples of Electrical/Electronic Equipment]

The thermally conductive silicone gel composition of the present invention is formed as a gel-like thermally conductive member with superior gap fill properties, flexibility, and thermal conductivity. Therefore, the composition of the present invention is also effective for electrical and electronic components with narrow gaps between electrodes, between electrical elements and electrical elements, between electrical elements and packages, and the like, or with structures that do not readily follow expansion and contraction of the silicone gel. For example, the composition can be used for semiconductor devices such as ICs, hybrid ICs, LSIs, and the like, electric circuits and modules in which such semiconductor devices, capacitors, electrical resistors, and other electronic elements are mounted, various sensors such as pressure sensors, igniters and regulators for automobiles, power generation systems, or power devices and the like for space transportation systems.

EXAMPLES

The present invention will be described below by way of examples; however, the present invention is not limited thereto. In the examples shown below, the following compounds or compositions were used as raw materials.

Components (A) to (G) were mixed as follows to obtain the thermally conductive silicone gel compositions of Examples 1 to 3 and Comparative Examples 1 to 6. Thereafter, a frame of 15 mm in height, 100 mm in length and 50 mm in width was created on a polypropylene sheet using a polyethylene backer, filled with the obtained composition, pressed by a Teflon (registered trademark) sheet on top for smoothing, and cured under an atmosphere of 25° C. for one day under unchanged conditions. After curing, the Teflon (registered trademark) sheet and polyethylene backer were removed to obtain a thermally conductive silicone gel composition.

The thermally conductive silicone gel compositions obtained by the number of parts shown in Examples 1 to 4 and Comparative Examples 1 to 6 are blended with component (D) so as to obtain a thermal conductivity of 5.0 W/mK. This thermal conductivity was measured by the hot disc method using a TPS-500 manufactured by Kyoto Electronics Industry Co., Ltd. by cutting the cured product obtained as described above into two pieces.

Tests regarding the effects related to the present invention were conducted as follows.
The viscosity, discharge volume, oil seepage distance, and curability of the thermally conductive silicone composition were measured as follows.
[Viscosity]
The viscosity (Pa-s) of the thermally conductive silicone composition at 25° C. was measured using the SHIMAZU CFT-500EX flow tester. The capillary die had a diameter of 1 mm, a stroke of 15 mm, and a test load of 30 kg. Liquid (I) and liquid (II) of the thermally conductive silicone gel composition were filled into 25 cc twin cartridges made by ADY Ltd., a static mixer MA6.3-12-S was mounted to the tips thereof, mixed by extrusion using a hand gun, and filled into a test container. The cylinder pressure at the time of measurement was $2.94 \times 10^6$ (Pa).
[Mixed Polymer Viscosity]
The viscosity (Pa-s) of the mixed polymers at 25° C. was measured using the Anton Paar RheoCompass MCR102. Geometry was measured using a 20 mm diameter cone plate with a shear rate of 10.0 (1/s).
[Discharge Rate]
The discharge volume (cc/10 min) of the thermally conductive silicone composition at 25° C. was measured using the SHIMAZU CFT-500EX flow tester. The same conditions as for the viscosity measurement above were used.
[Oil Seepage Distance]
On a frosted surface of a single-sided frosted glass of 50 mm in length, 50 mm in width, and 1 mm in thickness, a Kimtowel (Nippon Paper Crecia Co., Ltd.) cut to the same size was placed with the rough side up, and then a PTFE plate of 50 mm in length, 50 mm in width, 3 mm in thickness, and with a hole of 10 mm in diameter opened in the center was placed on the top thereof and the two ends were secured with clips. The hole in the center was filled with the thermally conductive silicone gel composition so that there were no gaps, the surface was scraped off with a spatula, and the product was cured for 24 hours at 25° C. with this surface facing up. Thereafter, the oil seepage distance from the back of the frosted glass was measured in the longitudinal and crosswise directions, and the average value was calculated. Ideally, the seepage distance should be within 2 times (20 mm) the 10 mm in diameter. For seepage distances greater than this, separation of the composition components is likely to occur in the static mixer.
[Curability]
0.5 g of the thermally conductive silicone gel composition was extruded onto a PP film of about 0.1 mm in thickness cut into 50 mm in length and 50 mm in width from a hand gun mounted on the static mixer MA6.3-12-S as described above and then weighed. Thereafter, a PP film of the same size was placed on top and flattened to a thickness of about 1 mm. Twenty shots were repeatedly dispensed from the static mixer to create 20 test pieces. After curing at 25° C. for 24 hours, the PP film was peeled off to check the curability. Test pieces in which the cured thermally conductive silicone gel composition peeled off the PP film without damage were considered to have passed the test, and those in which the cured thermally conductive silicone gel composition was destroyed were considered to have failed the test. The ultimate goal of this invention is for all 20 of them to pass the test.
[Appearance Check after Curing]
During the curing confirmation described above, the appearance of the cured thermally conductive silicone gel composition was checked. The colors of liquid (I) and liquid (II) were changed to check the uniformity of the colors after mixing. Those that were uniform were considered to have passed and those where a mottled pattern or other non-uniformity of color were considered to have failed.

The composition of the present invention is formed using each of the following components.
Component (A):
  Hereinafter, the degree of polymerization of siloxane of the polysiloxane that is component (A) is a calculated value of the degree of polymerization of siloxane units based on the number average molecular weight of each siloxane obtained using NMR.
  A-1-1: dimethylpolysiloxane capped at both molecular terminals with dimethylvinylsiloxy groups (viscosity 60 mPa-s, Vi content 1.53% by mass, degree of polymerization 96)
  Non-A-1-2: dimethylpolysiloxane capped at both molecular terminals with dimethylvinylsiloxy groups (viscosity 400 mPa-s, Vi content 0.43% by mass, degree of polymerization 206)
  A-2-1: dimethylpolysiloxane capped at both molecular terminals with dimethylvinylsiloxy groups (viscosity 10,000 mPa-s, Vi content 0.14% by mass, degree of polymerization 540)
  A-2-2: dimethylpolysiloxane capped at both molecular terminals with dimethylvinylsiloxy groups (viscosity: 42,000 mPa-s, Vi content: 0.09% by mass, degree of polymerization: 797)
  A-2-3: dimethylsiloxane capped at both molecular terminals with dimethylvinylsiloxy groups (plasticity 144, Vi content 0.01% by mass, degree of polymerization 4,470)

[Plasticity]

The plasticity was expressed as a value measured in accordance with the method prescribed in JIS K 6249 (the thickness when a 1 kgf load was applied for 3 minutes to a 4.2 g spherical sample at 25° C. was read up to 1/100 mm, and this value was multiplied by 100).

Component (B):
- B-1: methylhydrogen siloxane-dimethylsiloxane copolymer capped at both molecular terminals with trimethylsiloxy groups, average of 2 in the molecule, average of 2 in the side molecular chain (viscosity: 20 mPa·s, Si—H content: 0.10% by mass)
- Non-B-2: methylhydrogen siloxane-dimethylsiloxane copolymer capped at both molecular terminals with trimethylsiloxy groups, average of 5 in the molecule, average of 5 in the side molecular chain (viscosity: 5 mPa·s, Si—H content: 0.75% by mass)

Component (C):
- C-1: Complex of platinum and 1,3-divinyl-1,1,3,3-tetramethyldisiloxane with a platinum concentration of 0.6% by weight Component (D):
- D-1: Crushed aluminum oxide powder with an average particle diameter of 0.4 μm
- D-2: Crushed aluminum oxide powder with an average particle diameter of 2.5 μm
- D-3: Spherical melt-solidified aluminum oxide powder with an average particle diameter of 35 μm Component (€):
- E-1: Decyltrimethoxysilane Component (F):
- F-1: Polyorganosiloxane represented by the following formula

[Formula 4]

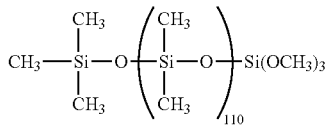

Component (G):
- G-1: 29H,31H-phthalocyaninato(2-)-N29,N30,N31,N32-copper

Example 1

100 parts by mass of component (A-1-1), 4.3 parts by mass of component (A-2-1), 12.8 parts by mass of component (E-1), and 12.8 parts by mass of component (F-1) were weighed, to which 427 parts by mass of component (D-1), 427 parts by mass of component (D-2), and 1,154 parts by mass of component (D-3) were sequentially mixed in over a period of 60 minutes. After homogenization, the mixture was heated and mixed at 160° C. for 90 minutes under reduced pressure, and then cooled to room temperature. To this mixture, 0.486 parts by mass of component (C-1) were mixed to obtain liquid (I) of the thermally conductive silicone composition.

Next, 100 parts by mass of component (F-1), 4.9 parts by mass of component (E-1), and 2.96 parts by mass of component (G-1) were weighed, to which 493 parts by mass of component (D-1), 493 parts by mass of component (D-2), and 1,330 parts by mass of component (D-3) were sequentially mixed in over 60 minutes. After homogenization, the mixture was heated and mixed at 160° C. for 90 minutes under reduced pressure, and then cooled to room temperature.

To this mixture, 29.8 parts by mass of component (B-1), 0.74 parts by mass of component (Non-B-2), 4.9 parts by mass of component (Non-A-1-2) and 0.025 parts by mass of phenylbutynol as a master batched reaction inhibitor were mixed in until uniform to obtain liquid (II) of the thermally conductive silicone composition.

The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

The viscosity [A-1][A-2]/viscosity [A-1] of this composition was 1.23 (mixture viscosity 75 m Pa·s).

Example 2

Liquid (I) and liquid (II) of the thermally conductive silicone composition were obtained in the same manner as in Example 1, except that 4.3 parts by mass of component (A-2-1) in Example 1 were replaced with 4.3 parts by mass of component (A-2-2).

The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

The viscosity [A-1][A-2]/viscosity [A-1] of this composition was 1.31 (mixture viscosity 80 m Pa·s).

Example 3

Liquid (I) and liquid (II) of the thermally conductive silicone composition were obtained in the same manner as in Example 1, except that 4.3 parts by mass of component (A-2-1) in Example 1 were replaced with 8.5 parts by mass of component (A-2-2).

The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

The viscosity [A-1][A-2]/viscosity [A-1] of this composition was 1.67 (mixture viscosity 100 m Pa·s).

TABLE 1

| Component | Example 1 liquid (I) | Example 1 liquid (II) | Example 2 liquid (I) | Example 2 liquid (II) | Example 3 liquid (I) | Example 3 liquid (II) |
|---|---|---|---|---|---|---|
| A-1-1 | 100 | | 100 | | 100 | |
| A-2-1 | 4.3 | | | | | |
| A-2-2 | | | 4.3 | | 8.5 | |
| B-1 | | 29.8 | | 29.8 | | 29.8 |
| Non-B-2 | | 0.74 | | 0.74 | | 0.74 |
| C-1 | 0.486 | | 0.486 | | 0.486 | |
| D-1 | 427 | 493 | 427 | 493 | 427 | 493 |
| D-2 | 427 | 493 | 427 | 493 | 427 | 493 |
| D-3 | 1154 | 1330 | 1154 | 1330 | 1154 | 1330 |
| E-1 | 12.8 | 4.9 | 12.8 | 4.9 | 12.8 | 4.9 |
| F-1 | 12.8 | 100 | 12.8 | 100 | 12.8 | 100 |
| G-1 | | 2.96 | | 2.96 | | 2.96 |
| phenylbutynol | | 0.025 | | 0.025 | | 0.025 |
| Non-A-1-2 | | 4.9 | | 4.9 | | 4.9 |
| Viscosity [A-1][A-2]/ Viscosity[A-1] | 1.23 | | 1.31 | | 1.67 | |
| Si—H/Molar ratio of alkenyl group | 0.50 | | 0.50 | | 0.49 | |
| Appearance before mixing | Grey | Blue | Grey | Blue | Grey | Blue |
| Oil seepage distance (mm) | 21 | 15 | 17 | 15 | 18 | 15 |
| Viscosity (Pa-s) | 21 | | 23 | | 20 | |
| Discharge rate (cc/10 min) | 208 | | 185 | | 218 | |
| Curability | Passed (20/20) | | Passed (20/20) | | Passed (20/20) | |
| Appearance after mixing | Pass | | Pass | | Pass | |

Example 4

Liquid (I) and liquid (II) of the thermally conductive silicone composition were obtained in the same manner as in Example 1, except that 4.3 parts by mass of component (A-2-1) in Example 1 were replaced with 1.5 parts by mass of component (A-2-3).

The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

The viscosity [A-1][A-2]/viscosity [A-1] of this composition was 1.98 (mixture viscosity 119 m Pa-s).

Example 5

Liquid (I) and liquid (II) of the thermally conductive silicone composition were obtained in the same manner as in Example 1, except that 4.3 parts by mass of component (A-2-1) in Example 1 were replaced with 4.0 parts by mass of component (A-2-3).

The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

The viscosity [A-1][A-2]/viscosity [A-1] of this composition was 5.17 (mixture viscosity 310 m Pa-s).

TABLE 2

| Component | Example 4 liquid (I) | Example 4 liquid (II) | Example 5 liquid (I) | Example 5 liquid (II) |
|---|---|---|---|---|
| A-1-1 | 100 | | 100 | |
| A-2-3 | 1.5 | | 4.0 | |
| B-1 | | 29.8 | | 29.8 |
| Non-B-2 | | 0.74 | | 0.74 |
| C-1 | 0.486 | | 0.486 | |
| D-1 | 427 | 493 | 427 | 493 |
| D-2 | 427 | 493 | 427 | 493 |
| D-3 | 1154 | 1330 | 1154 | 1330 |
| E-1 | 12.8 | 4.9 | 12.8 | 4.9 |
| F-1 | 12.8 | 100 | 12.8 | 100 |
| G-1 | | 2.96 | | 2.96 |
| phenylbutynol | | 0.025 | | 0.025 |
| Non-A-1-2 | | 4.9 | | 4.9 |
| Viscosity [A-1][A-2]/ Viscosity[A-1] | 1.98 | | 5.17 | |
| Si—H/ Molar ratio of alkenyl group | 0.50 | | 0.50 | |
| Appearance before mixing | Grey | Blue | Grey | Blue |
| Oil seepage distance (mm) | 20 | 15 | 14 | 15 |
| Viscosity (Pa-s) | 36 | | 48 | |
| Discharge rate (cc/10 min) | 120 | | 90 | |
| Curability | Passed (20/20) | | Passed (20/20) | |
| Appearance after mixing | Pass | | Pass | |

Comparative Example 1

Liquid (I) and liquid (II) of the thermally conductive silicone composition were obtained in the same manner as in Example 1, except that 4.3 parts by mass of component (A-2-1) in Example 1 were removed.

The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

This composition did not contain component (A-2), and the viscosity [A-1][A-2]/viscosity [A-1] was 1.00 (mixed viscosity 60 mPa-s).

Comparative Example 2

Liquid (I) and liquid (II) of the thermally conductive silicone composition were obtained in the same manner as in Comparative Example 1, except that 100 parts by mass of component (A-1-1) in Comparative Example 1 were replaced with 100 parts by mass of component (non-A-1-2). The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

This composition does not contain either component (A-1) or component (A-2).

Comparative Example 3

Liquid (I) and liquid (II) of the thermally conductive silicone composition were obtained in the same manner as in Comparative Example 1, except that 100 parts by mass of component (A-1-1) in Comparative Example 1 were replaced with 68 parts by mass of component (A-1-1) and 32 parts by mass of component (non-A-1-2).

The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

This composition did not contain component (A-2), and the viscosity [A-1][A-2]/viscosity [A-1] was 1.00 (mixed viscosity 110 mPa-s).

Comparative Example 4

Liquid (I) and liquid (II) of the thermally conductive silicone composition were obtained in the same manner as in Example 2, except that 4.3 parts by mass of component (A-2-2) in Example 2 were replaced with 1.0 parts by mass. The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

The viscosity [A-1][A-2]/viscosity [A-1] of this composition was 1.07 (mixture viscosity 65 m Pa-s).

Comparative Example 5

Liquid (I) and liquid (II) of the thermally conductive silicone composition were obtained in the same manner as in Example 2, except that 4.3 parts by mass of component (A-2-2) in Example 2 were replaced with 2.0 parts by mass. The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

The viscosity [A-1][A-2]/viscosity [A-1] of this composition was 1.14 (mixture viscosity 70 m Pa-s).

Comparative Example 6

Liquid (I) and liquid (II) of the thermally conductive silicone composition were obtained in the same manner as in Example 1, except that 4.3 parts by mass of component (A-2-1) in Example 1 were replaced with 4.3 parts by mass of component (non-A-1-2).

The thermally conductive silicone compositions described above were filled separately as liquid (I) and liquid (II) in 25 cc twin cartridges manufactured by ADY Ltd. A static mixer MA6.3-12-S was mounted to the tip, and viscosity and discharge volume were measured with a SHIMAZU flow tester CFT-500EX while extruding with a hand gun and mixing. The oil seepage distance, curing performance, and appearance after curing were checked continuously.

This composition did not contain component (A-2), and the viscosity [A-1][A-2]/viscosity [A-1] was 1.00 (mixture viscosity 65 mPa-s).

TABLE 3

| Component | Comparative Example 1 liquid (I) | Comparative Example 1 liquid (II) | Comparative Example 2 liquid (I) | Comparative Example 2 liquid (II) | Comparative Example 3 liquid (I) | Comparative Example 3 liquid (II) |
|---|---|---|---|---|---|---|
| A-1-1 | 100 | | | | 68 | |
| Non-A-1-2 | | | 100 | | 32 | |
| B-1 | | 29.8 | | 29.8 | | 29.8 |
| Non-B-2 | | 0.74 | | 0.74 | | 0.74 |
| C-1 | 0.486 | | 0.486 | | 0.486 | |
| D-1 | 427 | 493 | 427 | 493 | 427 | 493 |
| D-2 | 427 | 493 | 427 | 493 | 427 | 493 |
| D-3 | 1154 | 1330 | 1154 | 1330 | 1154 | 1330 |
| E-1 | 12.8 | 4.9 | 12.8 | 4.9 | 12.8 | 4.9 |
| F-1 | 12.8 | 100 | 12.8 | 100 | 12.8 | 100 |
| G-1 | | 2.96 | | 2.96 | | 2.96 |
| phenylbutynol | | 0.025 | | 0.025 | | 0.025 |

TABLE 3-continued

|  | Comparative Example 1 | | Comparative Example 2 | | Comparative Example 3 | |
| --- | --- | --- | --- | --- | --- | --- |
| Component | liquid (I) | liquid (II) | liquid (I) | liquid (II) | liquid (I) | liquid (II) |
| Non-A-1-2 |  | 4.90 |  | 4.90 |  | 4.90 |
| Viscosity [A-1][A-2]/Viscosity[A-1] | 1.00 | | — | | 1.00 | |
| Si—H/Molar ratio of alkenyl group | 0.50 | | 1.40 | | 0.63 | |
| Appearance before mixing | Grey | Blue | Grey | Blue | Grey | Blue |
| Oil seepage distance (mm) | 23 | 15 | 16 | 15 | 17 | 15 |
| Viscosity (Pa-s) | 33 | | 36 | | 32 | |
| Discharge rate (cc/10 min) | 132 | | 137 | | 122 | |
| Curability | Rejected (10/20) | | Passed (20/20) | | Passed (20/20) | |
| Appearance after mixing | Pass | | Rejected (uneven) | | Rejected (uneven) | |

TABLE 4

|  | Comparative Example 4 | | Comparative Example 5 | | Comparative Example 6 | |
| --- | --- | --- | --- | --- | --- | --- |
| Component | liquid (I) | liquid (II) | liquid (I) | liquid (II) | liquid (I) | liquid (II) |
| A-1-1 | 100 | | 100 | | 100 | |
| Non-A-1-2 |  | | | | 4.3 | |
| A-2-2 | 1.0 | | 2.0 | | | |
| B-1 |  | 29.8 | | 29.8 | | 29.8 |
| Non-B-2 |  | 0.74 | | 0.74 | | 0.74 |
| C-1 | 0.486 | | 0.486 | | 0.486 | |
| D-1 | 427 | 493 | 427 | 493 | 427 | 493 |
| D-2 | 427 | 493 | 427 | 493 | 427 | 493 |
| D-3 | 1154 | 1330 | 1154 | 1330 | 1154 | 1330 |
| E-1 | 12.8 | 4.9 | 12.8 | 4.9 | 12.8 | 4.9 |
| F-1 | 12.8 | 100 | 12.8 | 100 | 12.8 | 100 |
| G-1 |  | 2.96 | | 2.96 | | 2.96 |
| phenylbutynol |  | 0.025 | | 0.025 | | 0.025 |
| Non-A-1-2 |  | 4.90 | | 4.90 | | 4.90 |
| Viscosity [A-1][A-2]/Viscosity[A-1] | 1.07 | | 1.14 | | 1.00 | |
| Si—H/Molar ratio of alkenyl group | 0.50 | | 0.50 | | 0.49 | |
| Appearance before mixing | Grey | Blue | Grey | Blue | Grey | Blue |
| Oil seepage distance (mm) | 22 | 15 | 22 | 15 | 23 | 15 |
| Viscosity (Pa-s) | 23 | | 23 | | 21 | |
| Discharge rate (cc/10 min) | 189 | | 187 | | 208 | |
| Curability | Rejected (18/20) | | Rejected (18/20) | | Rejected (18/20) | |
| Appearance after mixing | Pass | | Pass | | Pass | |

SUMMARY

As shown in Examples 1 to 5, when the viscosity [A-1][A-2]/viscosity [A-1] is in the range of 1.15 to 5.50, in each thermally conductive silicone gel composition according to the present invention (design value of thermal conductivity: 5.0 W/mK), liquid (I) and liquid (II) both showed little oil seepage before curing, in addition to favorable and sufficient mixability from a practical viewpoint and stable curability in mixing with a static mixer. In particular, the thermally conductive silicone gel compositions in which the viscosity [A-1][A-2]/viscosity [A-1] shown in Examples 1 to 4 is in the range of 1.20 to 2.00, and a mixture viscosity of 150 mPa-s or less, have in addition to the characteristics described above, very excellent dispense-ability and superior handleability and stability.

On the other hand, in Comparative Example 1, Comparative Example 4, and Comparative Example 5, the viscosity [A-1][A-2]/viscosity [A-1] was 1.00 to 1.14, and before curing, oil seepage was high in the liquid (I), and curability was not stable, in addition to not obtaining favorable mixability when mixing with a static mixer. Therefore, if the viscosity [A-1][A-2]/viscosity [A-1] of the range described in this patent is not satisfied, a stable multi-component thermally conductive silicone gel composition cannot be obtained.

In Comparative Examples 2 and 3, the oil seepage of liquid (I) before curing was low and the curability was stable in mixing with a static mixer, but the appearance of the cured product obtained was non-uniform and favorable mixability could not be obtained. If the viscosity of component (A-1), which is the main component, does not satisfy the range defined in this patent, or if component (A-2) is not used, a stable multi-component thermally conductive silicone gel composition cannot be obtained.

The invention claimed is:
1. A multi-component thermally conductive silicone gel composition, comprising:
   (A) an alkenyl group-containing organopolysiloxane comprising the following component (A-1) and component (A-2), where
      (A-1) is an alkenyl group-containing organopolysiloxane having a degree of polymerization of siloxane in the range of 5 to 100, and
      (A-2) is an alkenyl group-containing organopolysiloxane having a degree of polymerization of siloxane of 400 or more;
   (B) an organohydrogenpolysiloxane in an amount that provides 0.2 to 5 mol of silicon-bonded hydrogen atoms in component (B) with respect to 1 mol of alkenyl groups contained in component (A);
   (C) a catalyst for a hydrosilylation reaction in a catalytic amount;
   (D) thermally conductive filler;
   (E) one or more silane coupling agents or hydrolysis/condensation reaction products thereof; and
   (F) an organopolysiloxane having a hydrolyzable silyl group at the end of the molecular chain contained in a liquid (I) and a liquid (II); wherein:
      the content of component (D) in liquid (I) is in the range of 600 to 3,500 parts by mass relative to 100 parts by mass of component (A-1),
      the content of component (D) in liquid (II) is in the range of 600 to 3,500 parts by mass relative to 100 parts by mass of component (A-1), and
      component (A-1) and component (A-2) are present in the same system and the viscosity of these mixed polymers at 25° C. is in the range of 1.15 to 5.5 times the viscosity of component (A-1) at 25° C.

2. The multi-component thermally conductive silicone gel composition according to claim 1, wherein:
   the viscosity of component (A-1) at 25° C. is in the range of 10 to 100 mPa-S,
   the viscosity of component (A-2) at 25° C. is 10,000 mPa-s or more, and
   component (A-1) and component (A-2) are present in the same system, and the viscosity of the mixed polymers at 25° C. is in the range of 1.2 to 2.0 times the viscosity of component (A-1).

3. The multi-component thermally conductive silicone gel composition according to claim 1, wherein the thermal conductivity is 2.0 W/mK or more.

4. The multi-component thermally conductive silicone gel composition according to claim 1, wherein component (E) is made up of (E1) an alkoxysilane having an alkyl group with six or more carbon atoms in the molecule, and component (D) is surface treated by component (E) and component (F).

5. The multi-component thermally conductive silicone gel composition according to claim 1, wherein component (F) is an organopolysiloxane represented by the following general formula (1), or general formula (2), or a mixture thereof:
   (i) an organopolysiloxane represented by general formula (1):

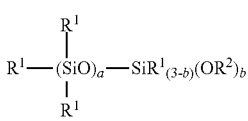

(1)

where $R^1$ are independent unsubstituted or substituted monovalent hydrocarbon groups, and $R^2$ are independent hydrogen atoms, alkyl groups, alkoxyalkyl groups, or acyl groups, a is an integer from 5 to 250, and b is an integer from 1 to 3, with a viscosity of 10 to less than 10,000 mPa-s at 25° C., (ii) an organopolysiloxane represented by general formula (2):

$$R^4{}_3SiO(R^4{}_2SiO)_pR^4{}_2Si-R^5-SiR^4{}_{(3-d)}(OR^3)_d \quad (2)$$

where $R^4$ are monovalent hydrocarbon groups of the same kind or a different kind, $R^5$ is an oxygen atom or a divalent hydrocarbon group, $R^3$ are independent hydrogen atoms, alkyl groups, alkoxyalkyl groups, or acyl groups, p is an integer from 100 to 500, and d is an integer from 1 to 3.

6. A multi-component thermally conductive silicone gel composition according to claim 1, wherein the content of component (D) in each of liquid (I) and liquid (II) is in the range of 80 to 98% by mass of the entire composition, and the composition is substantially free of fillers other than component (D).

7. The multi-component thermally conductive silicone gel composition according to claim 1, wherein component (B) is made up of (B1) a straight-chain organohydrogenpolysiloxane having a viscosity at 25° C. of 1 to 1,000 mPa-s and containing on average 2 to 4 silicon-bonded hydrogen atoms in the molecule, at least two of which are in the side molecular chain, with a relationship established between the silicon-bound hydrogen atoms ($[H_{B1}]$) in component (B1) of the composition and the content of silicon-bound hydrogen atoms in the organohydrogenpolysiloxane other than the component (B1) ($[H_{non-B1}]$), and the value of $[H_{non-B1}]/([H_{B1}]+[H_{non-B1}])$ is in the range of 0.0 to 0.70.

8. The multi-component thermally conductive silicone gel composition according to claim 1, further comprising (G) a heat resistance-imparting agent.

9. The multi-component thermally conductive silicone gel composition according to claim 1, wherein component (D) is:
   (D1) a plate-shaped boron nitride powder with an average particle size of 0.1 to 150 µm;
   (D2) a granulated or spherically compacted boron nitride powder with an average particle size of 0.1 to 500 µm;
   (D3) a spherically melt-solidified and/or crushed aluminum oxide powder with an average particle diameter of 0.01 to 50 µm; or
   (D4) a graphite having an average particle diameter of 0.01 to 50 µm; or
   a mixture of two or more of these.

10. The multi-component thermally conductive silicone gel composition according to claim 1, which is a two-component thermally conductive silicone gel composition comprising liquid (I) and liquid (II).

11. A thermally conductive member comprising the multi-component thermally conductive silicone gel composition according to claim 1 or a cured product thereof.

12. A heat dissipating structure provided with the thermally conductive member according to claim 11.

13. A heat dissipating structure comprising a heat dissipating member provided via the multi-component thermally conductive silicone gel composition according to claim 1 or cured product thereof on a heat dissipating component or a circuit board on which the heat dissipating component is mounted.

14. The heat dissipating structure according to claim 12, wherein the structure is an electrical or electronic device.

15. The heat dissipating structure according to claim 12, wherein the structure is an electrical or electronic component or a secondary battery.

16. The heat dissipating structure according to claim 13, wherein the structure is an electrical or electronic device.

17. The heat dissipating structure according to claim 13, wherein the structure is an electrical or electronic component or a secondary battery.

\* \* \* \* \*